(12) United States Patent
Chen et al.

(10) Patent No.: US 12,159,921 B2
(45) Date of Patent: Dec. 3, 2024

(54) SEMICONDUCTOR DEVICE AND METHOD OF MANUFACTURING THE SAME

(71) Applicant: Taiwan Semiconductor Manufacturing Co., Ltd., Hsinchu (TW)

(72) Inventors: I-Chih Chen, Tainan (TW); Ru-Shang Hsiao, Jhubei (TW); Ching-Pin Lin, Hsinchu (TW); Chih-Mu Huang, Tainan (TW); Fu-Tsun Tsai, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 106 days.

(21) Appl. No.: 17/881,317

(22) Filed: Aug. 4, 2022

(65) Prior Publication Data

US 2022/0376081 A1 Nov. 24, 2022

Related U.S. Application Data

(60) Continuation of application No. 17/157,180, filed on Jan. 25, 2021, now Pat. No. 11,437,495, which is a
(Continued)

(51) Int. Cl.
*H01L 29/66* (2006.01)
*H01L 21/8234* (2006.01)
(Continued)

(52) U.S. Cl.
CPC .. *H01L 29/6656* (2013.01); *H01L 21/823431* (2013.01); *H01L 21/823468* (2013.01);
(Continued)

(58) Field of Classification Search
CPC ............ H01L 29/6656; H01L 29/4232; H01L 29/66545; H01L 29/41791; H01L 29/7855;
(Continued)

(56) References Cited

U.S. PATENT DOCUMENTS

| 8,492,228 B1 * | 7/2013 | Leobandung ... | H01L 21/823462 257/E21.409 |
| 9,461,044 B1 * | 10/2016 | Chang ............. | H01L 21/823431 |

(Continued)

FOREIGN PATENT DOCUMENTS

| KR | 1020090003854 A | 1/2009 |
| KR | 20090025933 A | 3/2009 |

(Continued)

OTHER PUBLICATIONS

Official Action issued Jul. 29, 2019, in corresponding Taiwan Patent Application No. 10820717480.

*Primary Examiner* — Dao H Nguyen
(74) *Attorney, Agent, or Firm* — Duane Morris LLP

(57) ABSTRACT

A semiconductor device includes: first and second fin structures, disposed on a substrate, that respectively extend in parallel to an axis; a first gate feature that traverses the first fin structure to overlay a central portion of the first fin structure; a second gate feature that traverses the second fin structure to overlay a central portion of the second fin structure; a first spacer comprising: a first portion comprising two layers that respectively extend from sidewalls of the first gate feature toward opposite directions of the axis; and a second portion comprising two layers that respectively extend from sidewalls of the first portion of the first spacer toward the opposite directions of the axis; and a second
(Continued)

spacer comprising two layers that respectively extend from sidewalls of the second gate feature toward the opposite directions of the axis.

20 Claims, 33 Drawing Sheets

Related U.S. Application Data division of application No. 16/180,623, filed on Nov. 5, 2018, now Pat. No. 10,903,336.

(60) Provisional application No. 62/591,305, filed on Nov. 28, 2017.

(51) Int. Cl.
*H01L 27/088* (2006.01)
*H01L 29/423* (2006.01)

(52) U.S. Cl.
CPC ...... *H01L 27/0886* (2013.01); *H01L 29/4232* (2013.01); *H01L 29/66545* (2013.01); *H01L 27/088* (2013.01)

(58) Field of Classification Search
CPC .......... H01L 29/66795; H01L 29/7831; H01L 21/823431; H01L 21/823468; H01L 21/823418; H01L 21/823437; H01L 27/0886; H01L 27/088
See application file for complete search history.

(56) References Cited

U.S. PATENT DOCUMENTS

| | | |
|---|---|---|
| 9,627,375 B2 | 4/2017 | Chang et al. |
| 2006/0071275 A1 | 4/2006 | Brask et al. |
| 2009/0008688 A1 | 1/2009 | Park et al. |
| 2009/0078997 A1* | 3/2009 | Greene ............... H01L 27/1211 257/E21.294 |
| 2011/0278676 A1 | 11/2011 | Cheng et al. |
| 2014/0319623 A1 | 10/2014 | Tsai et al. |
| 2015/0014788 A1 | 1/2015 | Park et al. |
| 2015/0206974 A1* | 7/2015 | Lim ................... H01L 27/0924 257/288 |
| 2015/0228647 A1 | 8/2015 | Chang et al. |
| 2015/0236131 A1 | 8/2015 | Chang et al. |
| 2016/0155824 A1 | 6/2016 | Lin et al. |
| 2016/0190013 A1 | 6/2016 | Chang et al. |
| 2016/0197175 A1 | 7/2016 | Lee |
| 2016/0240652 A1 | 8/2016 | Ching et al. |
| 2016/0351568 A1 | 12/2016 | Chang et al. |
| 2017/0069737 A1 | 3/2017 | Choi et al. |
| 2017/0179284 A1 | 6/2017 | Kim et al. |
| 2017/0229452 A1 | 8/2017 | Chang et al. |
| 2018/0053692 A1 | 2/2018 | Cheng et al. |
| 2018/0145172 A1* | 5/2018 | Zhou ................ H01L 21/02008 |

FOREIGN PATENT DOCUMENTS

| | | |
|---|---|---|
| KR | 1020160038673 A | 4/2016 |
| KR | 101709400 B1 | 2/2017 |
| TW | 201543575 A | 11/2015 |

\* cited by examiner

SEMICONDUCTOR DEVICE AND METHOD OF MANUFACTURING THE SAME

CROSS-REFERENCE TO RELATED APPLICATIONS

This application is a continuation of U.S. patent application Ser. No. 17/157,180, filed Jan. 25, 2021 which is a divisional of U.S. patent application Ser. No. 16/180,623, filed on Nov. 5, 2018, now U.S. Pat. No. 10,903,336, which claims priority to U.S. Provisional Patent Application No. 62/591,305, filed on Nov. 28, 2017, each of which is incorporated by reference herein in its entirety.

BACKGROUND

Integrated circuits (IC's) typically include a large number of components, particularly transistors. One type of transistor is a metal-oxide-semiconductor field-effect-transistor (MOSFET). MOSFET devices typically include a gate structure on top of a semiconductor substrate. Both sides of the gate structure are doped to form source and drain regions. A channel is formed between the source and drain regions beneath the gate. Based on a voltage bias applied to the gate, electric current may either be allowed to flow through the channel or be inhibited from doing so.

In some cases, the channel may be formed as a fin-like structure (herein "fin"). Such a fin protrudes beyond a top surface of the substrate and runs perpendicular to the gate structure formed on the substrate and the fin. In general, a field-effect-transistor using such a fin as a channel is referred to as a fin field-effect-transistor ("FinFET"). The FinFET typically includes a gate feature traversing a central portion of the protruded fin and a pair of source/drain features, along the fin, that are laterally disposed at sides of the gate feature.

Although when forming the FinFET in such three-dimensional fashion, the FinFET exhibits various advantages over a planar MOSFET (e.g., a stronger gate controllability, a higher scalability, etc.), the FinFET commonly presents a higher parasitic capacitance coupled between the gate feature and each of the pair of drain/source features when compared to the planar MOSFET. Such a higher parasitic capacitance generally results from more electromagnetical coupling induced between a sidewall of the gate feature and each of the pair of drain/source features. Various performance characteristics of the FinFET are deteriorated by the higher parasitic capacitance such as, for example, a reduced cut-off frequency, which may in turn limit applications of the FinFET (e.g., not suitable for radio frequency (RF) applications).

Accordingly, conventional FinFETs and methods to make the same are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1A:
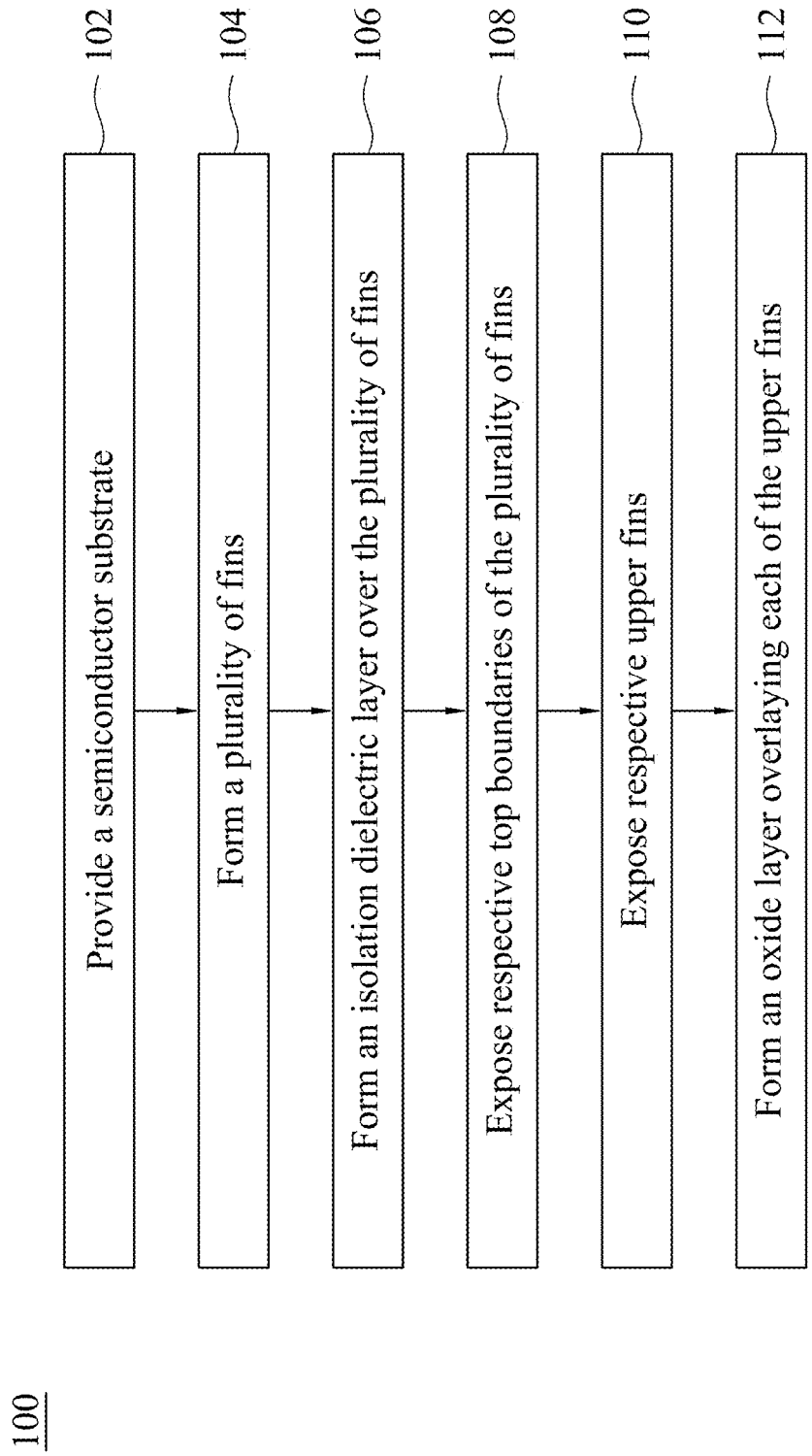
FIGS. 1A, 1B, and 1C collectively illustrate a flow chart of an embodiment of a method to form a semiconductor device, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a semiconductor device that includes a spacer formed of plural dielectric layers and method of forming the same. For example, the present disclosure provides various embodiments of a fin field-effect-transistor (FinFET) including a multi-layer spacer extending along respective sidewalls of the FinFET's gate feature, and methods to form the FinFET. By forming such a multi-layer spacer interposed between the gate feature and each of respective source/drain features of the FinFET, corresponding electromagnetic coupling (the parasitic capacitance) between the gate and source/drain feature can be significantly suppressed because of an increased distance coupled therebetween, for example. Accordingly, a cut-off frequency of the disclosed FinFET can be advantageously enhanced. Moreover, in some embodiments, the present disclosure provides some embodiments to concurrently form a plurality of FinFETs, a first subset of which each has a single-layer spacer, or a relatively thin multi-layer spacer, and a second subset of which each has a multi-layer spacer. As such, the first subset of FinFETs that is less sensitive to parasitic capacitance may be suitable for the use of logic applications (e.g., logic gates), and the second subset of FinFETs that is more sensitive to parasitic capacitance may be suitable for the use of radio frequency (RF) applications (e.g., RF transistors).

Figure 1B:
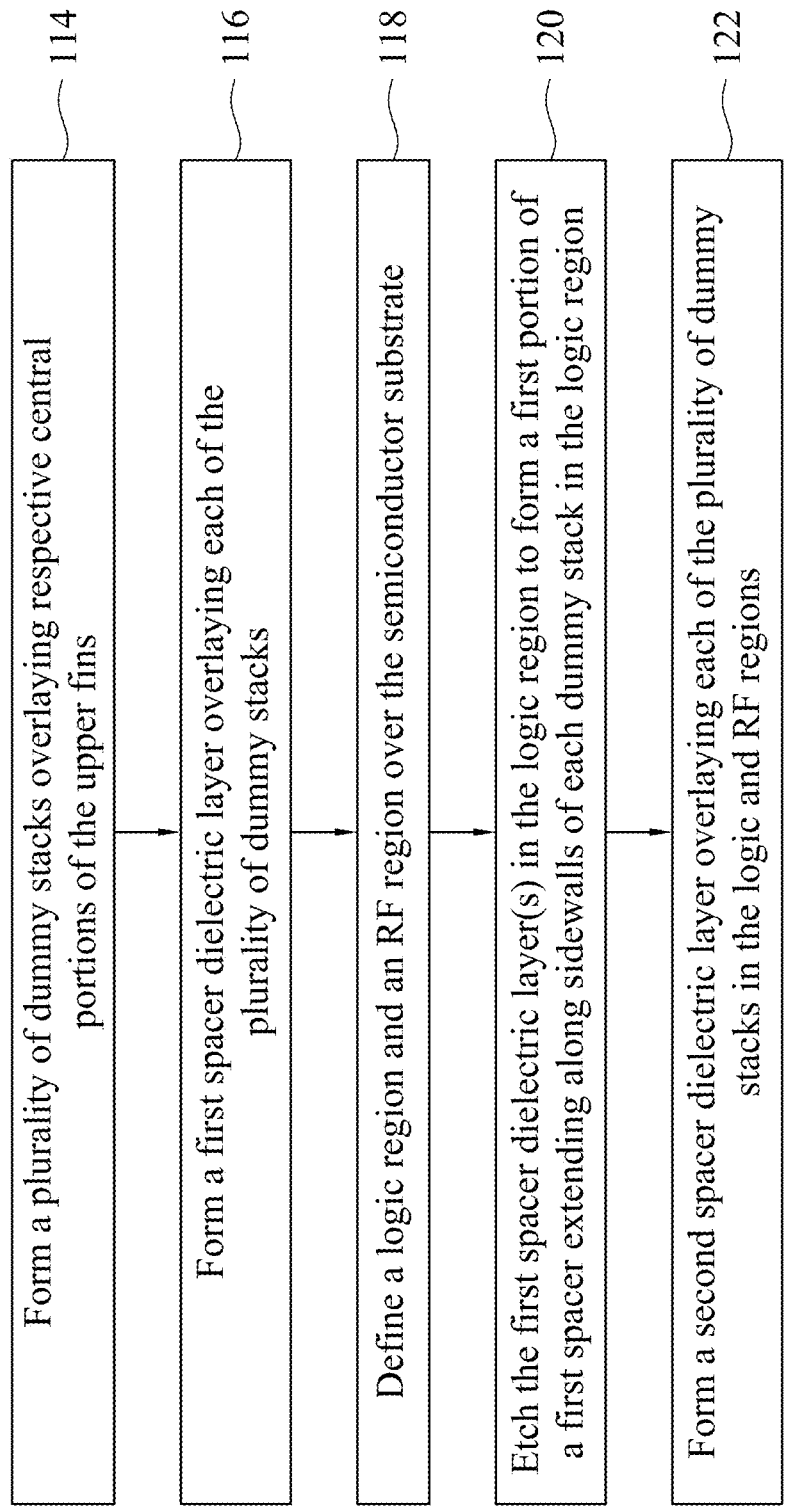
Figure 1C:
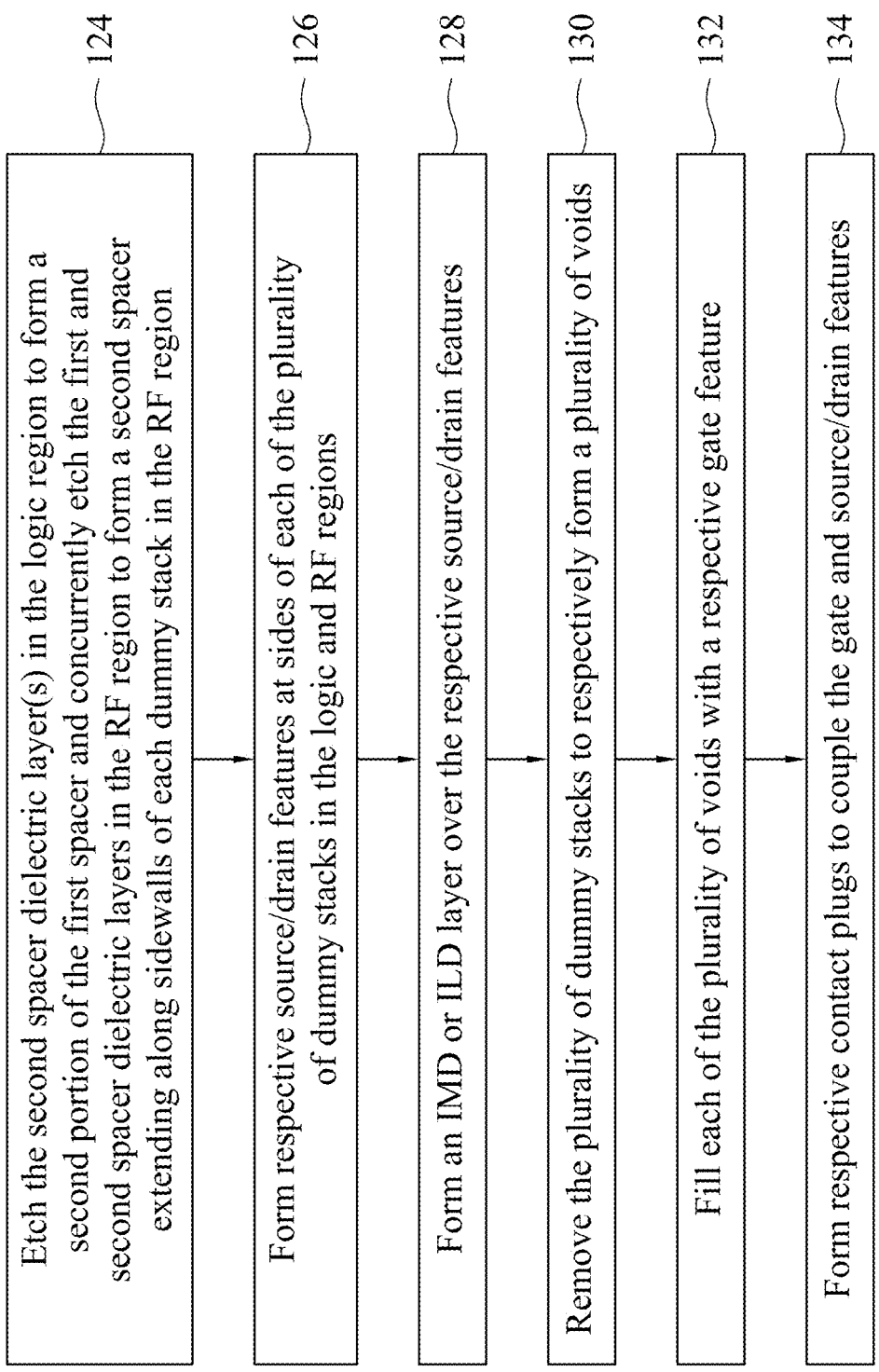

FIGS. 1A, 1B, and 1C collectively illustrate a flowchart of a method 100 to form a semiconductor device according to one or more embodiments of the present disclosure. It is noted that the method 100 is merely an example, and is not intended to limit the present disclosure. In some embodiments, the semiconductor device includes, at least respective portions of, two FinFETs. As employed in the present disclosure, the FinFET refers to any fin-based, multi-gate transistor. It is noted that the method of FIGS. 1A-1C does not produce a completed FinFET. A completed FinFET may be fabricated using complementary metal-oxide-semiconductor (CMOS) technology processing. Accordingly, it is understood that additional operations may be provided before, during, and after the method 100 of FIGS. 1A-1C, and that some other operations may only be briefly described herein.

Referring first to FIG. 1A, the method 100 starts with operation 102 in which a semiconductor substrate is provided. The method 100 continues to operation 104 in which a plurality of fins are formed. The method 100 continues to operation 106 in which an isolation dielectric layer is formed over the plurality of fins. The method 100 continues to operation 108 in which respective top boundaries of the plurality fins are exposed. The method 100 continues to operation 110 in which respective upper fins are exposed. The method 100 continues to operation 112 in which an oxide layer is formed to overlay each of the upper fins.

Next, in FIG. 1B, the method 100 continues to operation 114 in which a plurality of dummy stacks are formed to overlay respective central portions of the upper fins. The method 100 continues to operation 116 in which a first spacer dielectric layer is formed to overlay each of the plurality of dummy stacks. The method 100 continues to operation 118 in which a logic region and a radio frequency (RF) region are respectively defined over the semiconductor region. The method 100 continues to operation 120 in which the first spacer dielectric layer(s) in the logic region are each etched to form a first portion of a first spacer extending along sidewalls of each dummy stack in the logic region. After the etching process in the logic region, in some embodiments, the first portion of the first spacer may present a substantially thin thickness, and in some other embodiments, the first spacer dielectric layer(s) in the logic region may be completely removed (i.e., no presence of the first portion of the first spacer). For purposes of consistency, the following discussion of the method 100 continues with the embodiments in which the first portion of the first spacer remains present. The method 100 continues to operation 122 in which a second spacer dielectric layer is formed to overlay each of the plurality of dummy stacks in the logic and RF regions.

Referring then to FIG. 1C, the method 100 continues to operation 124 in which the second spacer dielectric layer(s) in the logic region are each etched to form a second portion of the first spacer, and concurrently, the first and second spacer dielectric layers in the RF region are etched to form a second spacer extending along sidewalls of each dummy stack in the RF region. The method 100 continues to operation 126 in which respective source/drain features are formed at sides of each of the plurality of dummy stacks in the logic and RF regions. The method 100 continues to operation 128 in which an inter-layer dielectric (ILD) or inter-metal dielectric (IMD) layer is formed over the respective source/drain features. The method 100 continues to operation 130 in which the plurality of dummy stacks are removed to respectively form a plurality of voids. The method continues to operation 132 in which each of the plurality of voids is filled with a respective gate feature. The method continues to operation 134 in which respective contact plugs are formed to couple the gate and source/drain features.

In some embodiments, operations of the method 100 may be associated with perspective views of a semiconductor device 200 at various fabrication stages as shown in FIGS. 2A, 3A, 4A, 5A, 6A, 7A, 8A, 9A, 10A, 11A, 12A, 13A, 14A, 15A, 16A, 17A, and 18A, respectively, and corresponding cross-sectional views as shown in FIGS. 2B, 3B, 4B, 5B, 6B, 7B, 8B, 9B/9C, 10B, 11B/11C/11D, 12B/12C/12D, 13B/13C, 14B/14C, 15B/15C, 16B/16C, 17B/17C, and 18B/18C. In some embodiments, the semiconductor device 200 may include at least two FinFETs. The semiconductor device 200 may be included in a microprocessor, memory cell, and/or other integrated circuit (IC). Also, FIGS. 2A through 18C are simplified for a better understanding of the concepts of the present disclosure. For example, although the figures illustrate the semiconductor device 200, it is understood the IC may comprise a number of other devices comprising resistors, capacitors, inductors, fuses, etc., which are not shown in FIGS. 2A through 18C, for purposes of clarity of illustration.

Figure 2A:
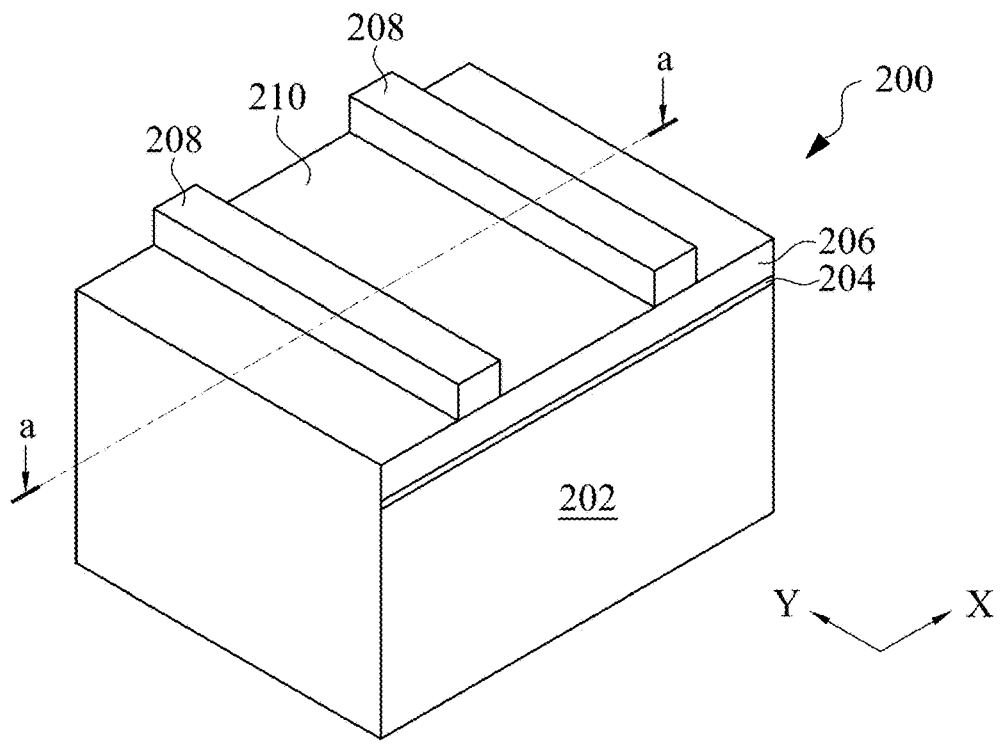
FIGS. 2A, 3A, 4A, 5A, 6A, 7A, 8A, 9A, 10A, 11A, 12A, 13A, 14A, 15A, 16A, 17A, and 18A illustrate perspective views of an exemplary semiconductor device, made by the method of FIGS. 1A-1C, during various fabrication stages, in accordance with some embodiments.
Figure 2B:
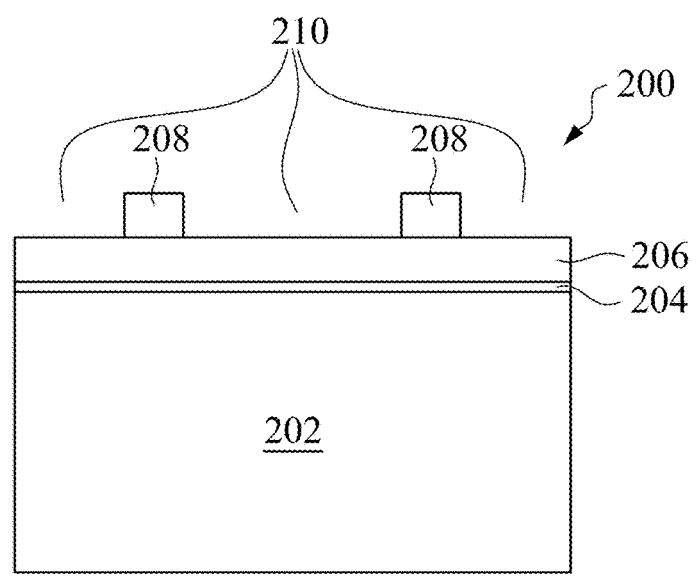
FIGS. 2B, 3B, 4B, 5B, 6B, 7B, 8B, 9B/9C, 10B, 11B/11C/11D, 12B/12C/12D, 13B/13C, 14B/14C, 15B/15C, 16B/16C, 17B/17C, and 18B/18C illustrate corresponding cross-sectional views of FIGS. 2A, 3A, 4A, 5A, 6A, 7A, 8A, 9A, 10A, 11A, 12A, 13A, 14A, 15A, 16A, 17A, and 18A, in accordance with some embodiments.

Corresponding to operation 102 of FIG. 1A, FIG. 2A is a perspective view of the semiconductor device 200 including a substrate 202 at one of the various stages of fabrication, according to some embodiments, and FIG. 2B is a cross-sectional view of the semiconductor device 200 taken along line a-a (the X axis) of FIG. 2A. As shown, the substrate 202 is covered by a pad layer 204, a mask layer 206, and a photo-sensitive layer 208 that is patterned with one or more openings 210. The photo-sensitive layer 208 is patterned to form fin(s) of the at least two FinFETs included in the semiconductor device 200, which will be discussed in the following operations.

In some embodiments, the substrate 202 comprises a crystalline silicon substrate (e.g., wafer). In some alternative embodiments, the substrate 202 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 202 may include an epitaxial layer (epi-layer), may be strained for performance enhancement, and/or may include a silicon-on-insulator (SOI) structure.

In some embodiments, the pad layer 204 may be a thin film comprising silicon oxide formed, for example, using a thermal oxidation process. The pad layer 204 may act as an adhesion layer between the semiconductor substrate 202 and the mask layer 206. The pad layer 204 may also act as an etch stop layer while etching the mask layer 206. In some embodiments, the mask layer 206 is formed of silicon nitride, for example, using low-pressure chemical vapor deposition (LPCVD) or plasma enhanced chemical vapor deposition (PECVD). The mask layer 206 is used as a hard mask during subsequent photolithography processes. The photo-sensitive layer 208 is formed on the mask layer 206, and then patterned thereby forming the openings 210 in the photo-sensitive layer 208.

Figure 3A:
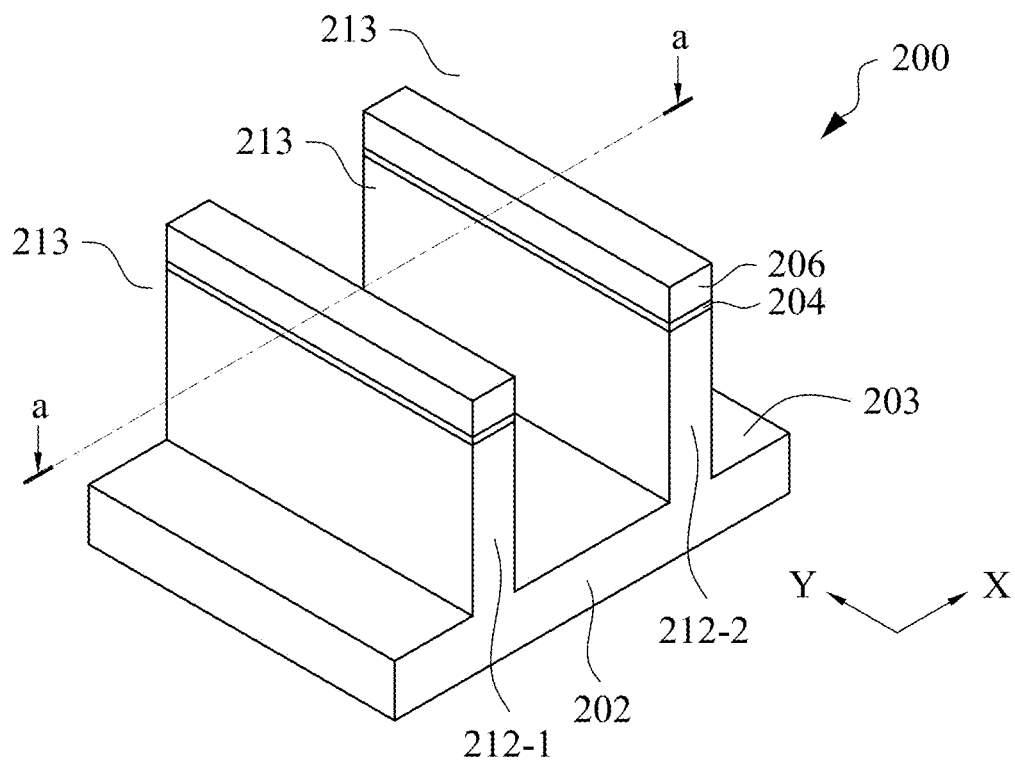
Figure 3B:
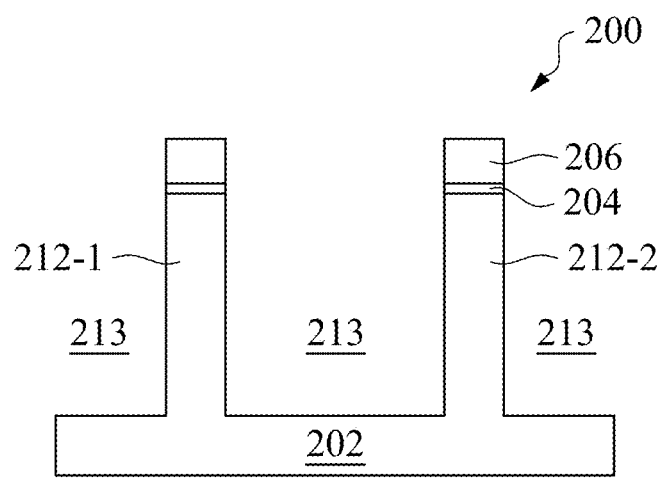

Corresponding to operation 104 of FIG. 1A, FIG. 3A is a perspective view of the semiconductor device 200 including a plurality of fins 212-1 and 212-2 at one of the various stages of fabrication, according to some embodiments, and FIG. 3B is a cross-sectional view of the semiconductor device 200 taken along line a-a (the X axis) of FIG. 3A. As shown, the fins 212-1 and 212-2 are spaced apart from each other by a central trench 213. It is noted that although only two fins 212-1 and 212-2 are shown in the illustrated embodiments of FIGS. 3A and 3B (and the following figures), any desired number of fins may be formed on the semiconductor substrate 202 using the photo-sensitive layer 208 (FIGS. 2A and 2B) with an according pattern. Thus, the left and right trenches 213 in FIGS. 3A and 3B may be respectively coupled between one of the shown fins 212-1 and 212-2, and another non-shown fin. For purposes of clarity, the fins 212-1 and 212-2 are herein referred to as "left fin 212-1" and "right fin 212-2" in the following discussions.

In some embodiments, the fins 212 are formed by at least some of the following processes. The mask layer 206 and pad layer 204 are etched through openings 210 (FIGS. 2A and 2B) to expose underlying semiconductor substrate 202. By using remaining pad layer 204 and the mask layer 206, as shown in FIGS. 3A and 3B, the exposed semiconductor substrate 202 is then etched to form the trenches 213 so as to cause a major surface 203 of the semiconductor substrate 202 to be exposed. Portions of the semiconductor substrate 202 sandwiched between the trenches 213 are thus formed as the fins 212. The fins 212 each extends upward from the major surface 203. The trenches 213 may be strips (viewed from the top of the semiconductor device 200) parallel to each other, and spaced with respect to each other. After the fins 212 are formed, the photo-sensitive layer 208 (not shown in FIGS. 3A and 3B for purposes of clarity) is removed. Subsequently, a cleaning process may be performed to remove a native oxide of the semiconductor substrate 202. The cleaning may be performed using diluted hydrofluoric (DEF) acid, or the like.

Figure 4A:
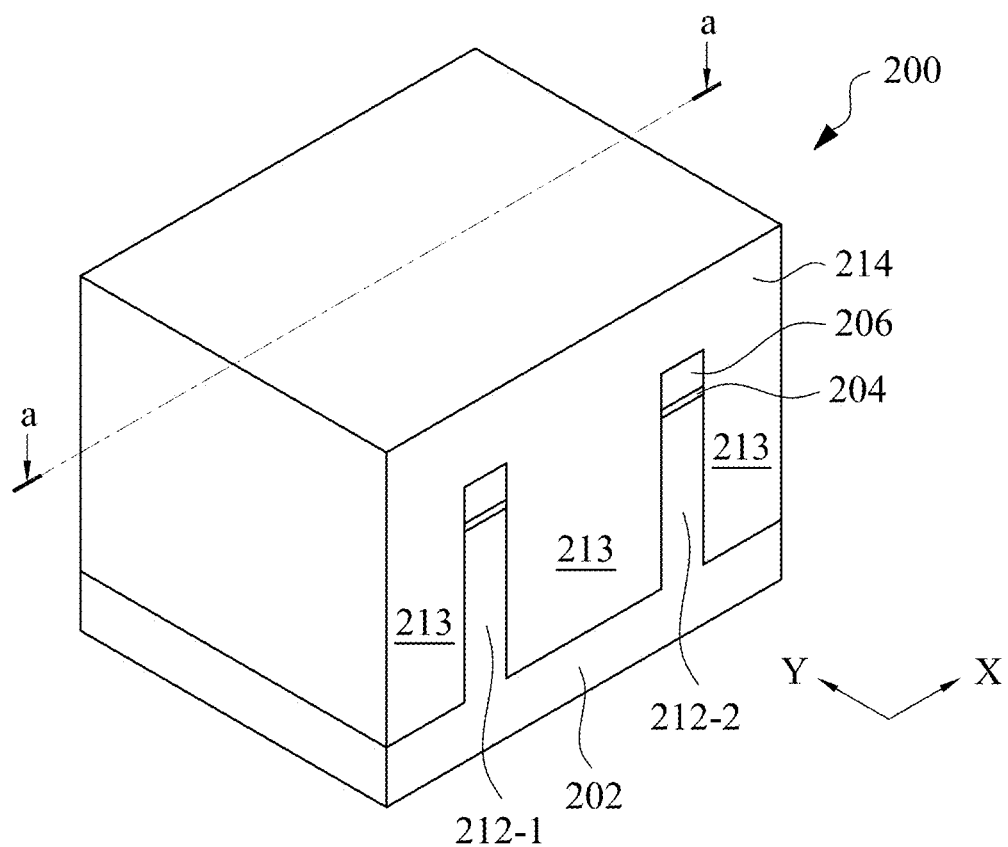
Figure 4B:
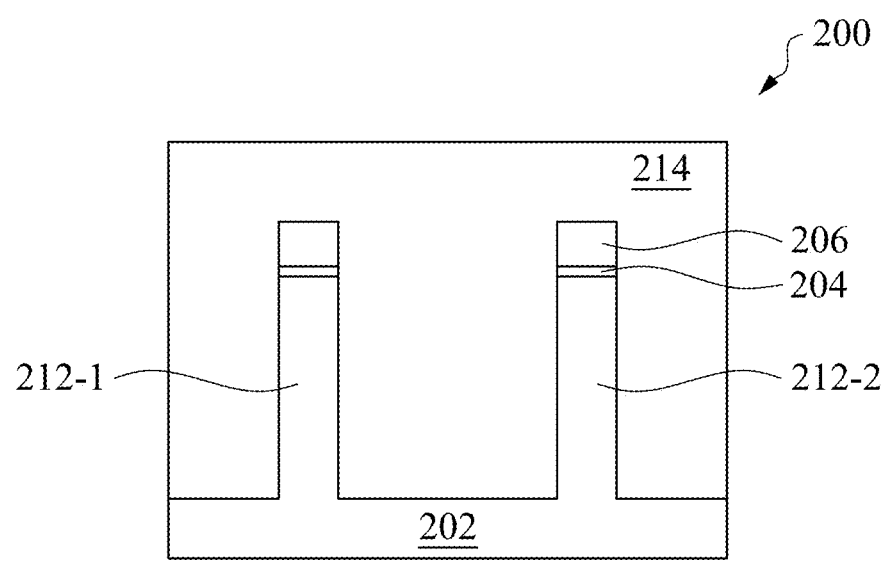

Corresponding to operation 106 of FIG. 1A, FIG. 4A is a perspective view of the semiconductor device 200 including an isolation dielectric material 214 formed over the substrate 202, the left and right fins 212-1 and 212-2, the pad layer 204, and the mask layer 206 at one of the various stages of fabrication, according to some embodiments, and FIG. 4B is a cross-sectional view of the semiconductor device 200 taken along line a-a (the X axis) of FIG. 4A. As shown, the isolation dielectric material 214 is formed over the whole semiconductor device 200 (e.g., overlaying the left and right fins 212-1 and 212-2) such that the entire trenches 213 are filled by the isolation dielectric material 214.

In an embodiment, the isolation dielectric material 214 may be deposited over the substrate 202 using a high-density-plasma (HDP) CVD process with reacting precursors, e.g., silane ($SiH_4$) and oxygen ($O_2$). In another embodiment, the isolation dielectric material 214 may be deposited over the substrate 202 using a sub-atmospheric CVD (SACVD) process or a high aspect-ratio process (HARP), wherein process gases used in such processes may comprise tetraethylorthosilicate (TEOS) and ozone ($O_3$). In yet another embodiment, the isolation dielectric material 214 may be deposited over the substrate 202 using a spin-on-dielectric (SOD) process such as, for example, hydrogen silsesquioxane (HSQ), methyl silsesquioxane (MSQ), or the like.

Figure 5A:
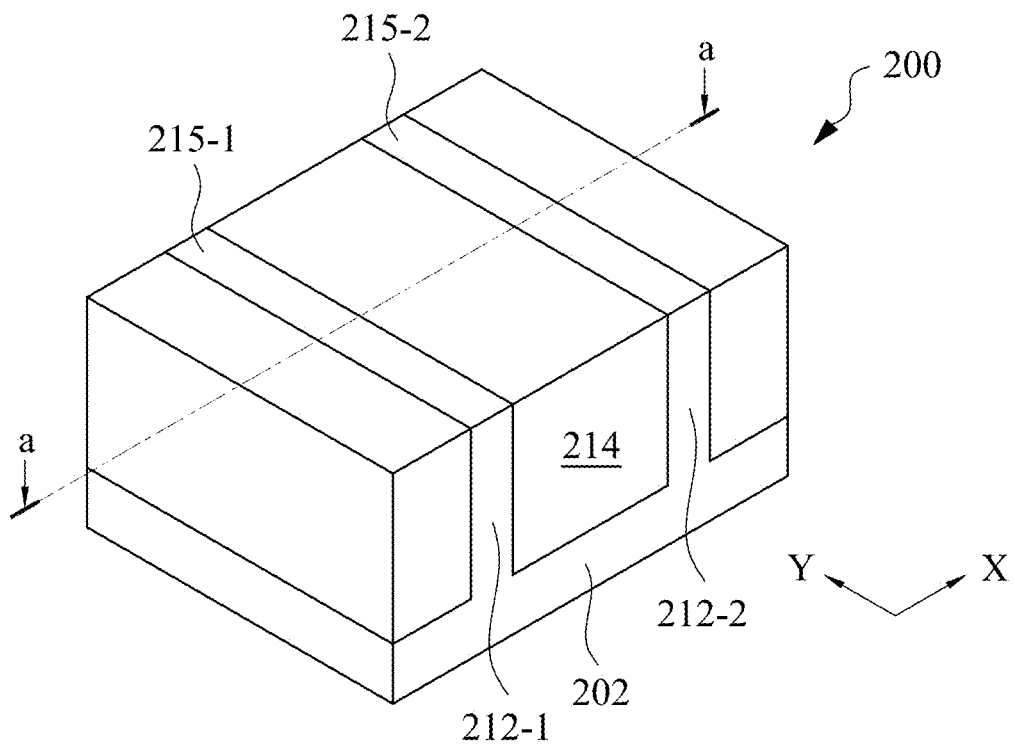
Figure 5B:
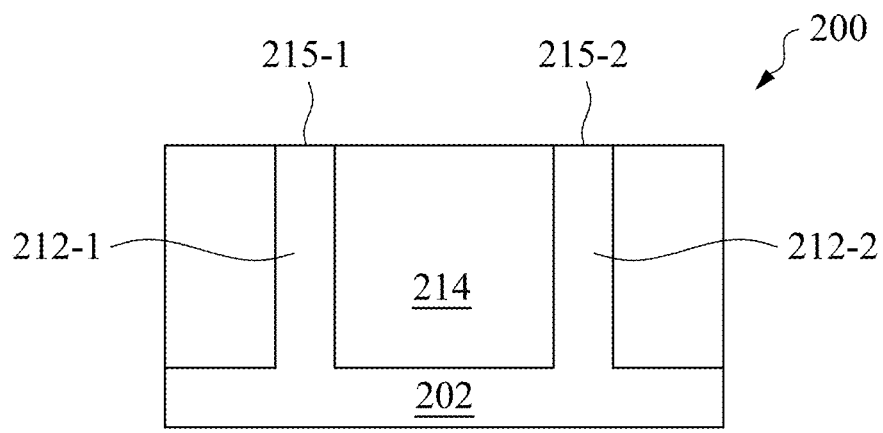

Corresponding to operation 108 of FIG. 1A, FIG. 5A is a perspective view of the semiconductor device 200 in which respective top boundaries 215-1 and 215-2 of the left and right fins 212-1 and 21-2 are exposed at one of the various stages of fabrication, according to some embodiments, and FIG. 5B is a cross-sectional view of the semiconductor device 200 taken along line a-a (the X axis) of FIG. 5A. In some embodiments, the top boundaries 215-1 and 215-2 are exposed by performing a polishing process (e.g., a chemical-mechanical polishing process) on the isolation dielectric material 214 (FIGS. 4A and 4B) until the mask layer 206 is again exposed. The mask layer 206 and the pad layer 204 are then removed to expose the top boundaries 215-1 and 215-2. In some embodiments, when the mask layer 206 is formed of silicon nitride, the mask layer 206 may be removed using a wet process using hot phosphoric acid ($H_3PO_4$), and when the pad layer 204 is formed of silicon oxide, the pad layer 204 may be removed using diluted hydrofluoric acid (HF). In some alternative embodiments, the removal of the mask layer 206 and the pad layer 204 may be performed after a recession process performed on the isolation dielectric material 214, which will be discussed in FIGS. 6A and 6B as follows.

Figure 6A:
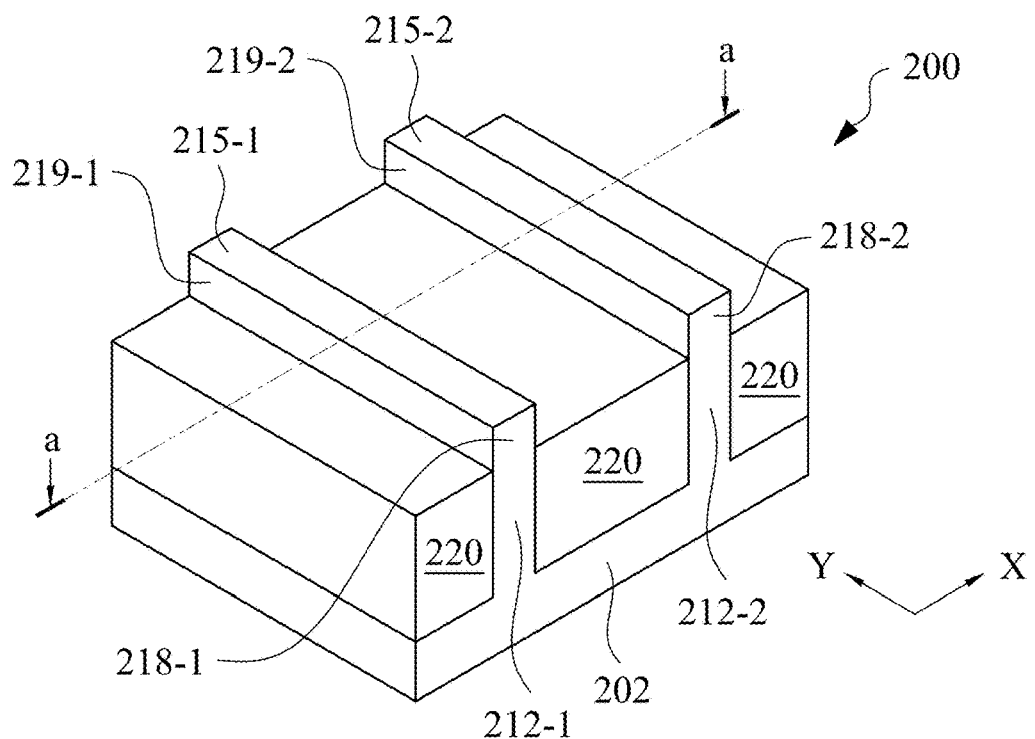
Figure 6B:
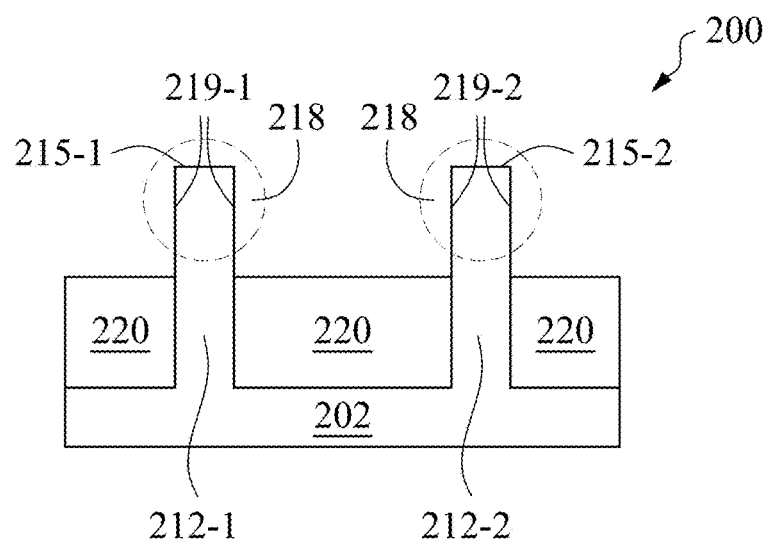

Corresponding to operation 110 of FIG. 1A, FIG. 6A is a perspective view of the semiconductor device 200 in which respective upper fins 218-1 and 218-2 of the left and right fins 212-1 and 212-2 are exposed at one of the various stages of fabrication, according to some embodiments, and FIG. 6B is a cross-sectional view of the semiconductor device 200 taken along line a-a (the X axis) of FIG. 6A. As shown in FIGS. 6A and 6B, an isolation feature 220 is formed between respective lower portions of the left and right fins 212-1 and 212-2 so as to expose the respective upper fins 218-1 and 218-2. Similarly, the upper fin 218-1 of the left fin 212-1 and the upper fin 218-2 of the right fin 212-2 are herein referred to as "left upper fin 218-1" and "right upper fin 218-2" in the following discussions. In some embodiments, after the left and right upper fins 218-1 and 218-2 are exposed, respective sidewalls 219-1 and 219-2 of the left and right upper fins 218-1 and 218-2 are further exposed.

In some embodiments, the isolation feature 220 may be formed by performing at least one etching process to recess an upper portion of the isolation dielectric material 214 (FIGS. 5A and 5B). In an embodiment, the etching process may include performing a wet etching process such as, for example, dipping the substrate 202 in a hydrofluoric acid (HF) solution to recess the upper portion of the isolation dielectric material 214 until the left and right upper fins 218-1 and 218-2 are respectively exposed. In another embodiment, the etching process may include performing a dry etching process such as, for example, using etching gases fluoroform ($CHF_3$) and/or boron trifluoride ($BF_3$) to recess the upper portion of the isolation dielectric material 214 until the left and right upper fins 218-1 and 218-2 are respectively exposed.

Figure 7A:
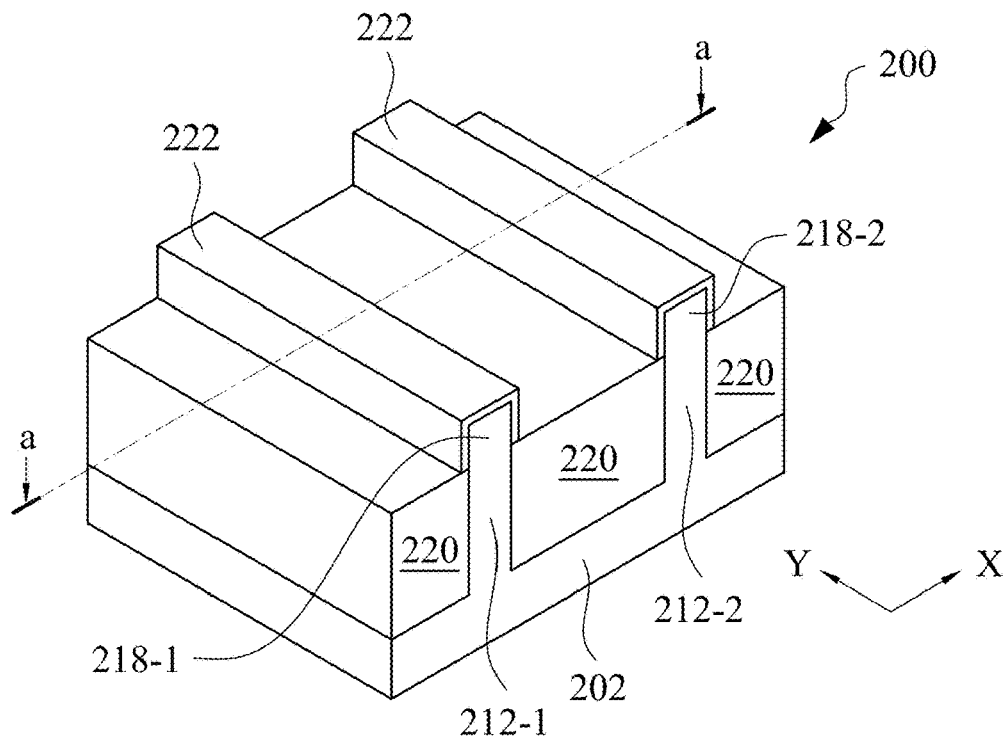
Figure 7B:
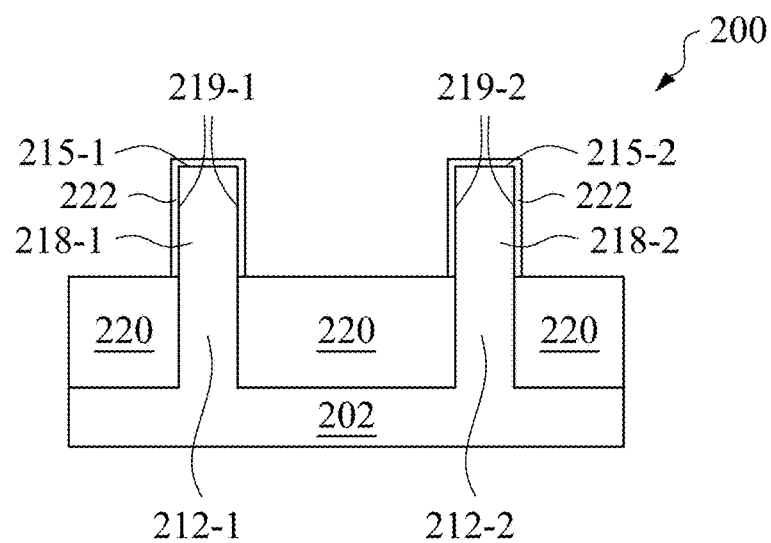

Corresponding to operation 112 of FIG. 1A, FIG. 7A is a perspective view of the semiconductor device 200 including an oxide layer 222 overlaying each of the left and right upper fins 218-1 and 218-2 at one of the various stages of fabrication, according to some embodiments, and FIG. 7B is a cross-sectional view of the semiconductor device 200 taken along line a-a (the X axis) of FIG. 7A. As shown further in FIG. 7B, the oxide layer 222 is formed to extend along the sidewall 219-1/219-2 and overlay the top boundary 215-1/215-2 of each of the left and right upper fins 218-1 and 218-2. In some embodiments, the oxide layer 222 may be formed by using a thermal oxidation process, an atomic layer deposition (ALD) process, a chemical vapor deposition (CVD) process, or the like. In the embodiments in which the left and right upper fins 218-1 and 218-2 are formed of silicon, the oxide layer 222 may include silicon oxide.

Figure 8A:
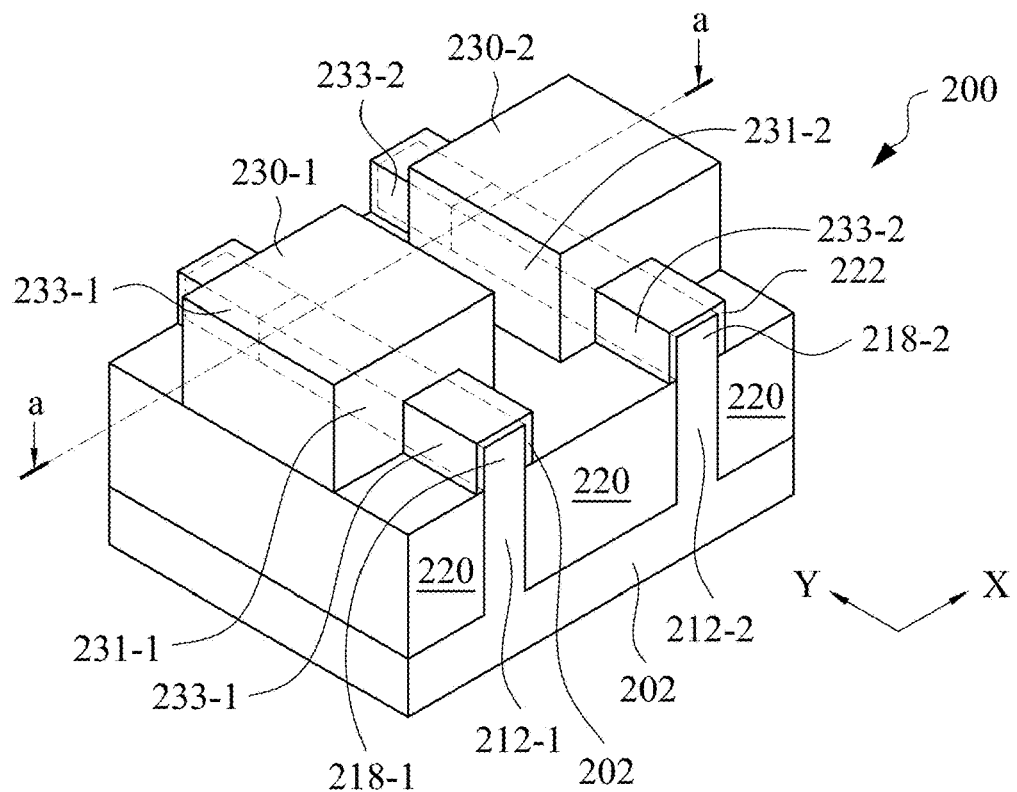
Figure 8B:
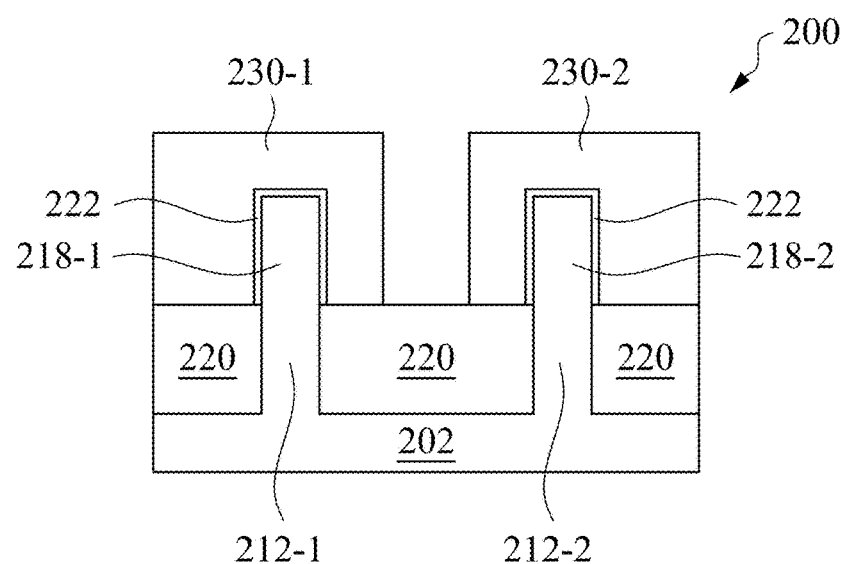

Corresponding to operation 114 of FIG. 1B, FIG. 8A is a perspective view of the semiconductor device 200 including a plurality of dummy stacks 230-1 and 230-2, which are formed at one of the various stages of fabrication, according to some embodiments, and FIG. 8B is a cross-sectional view of the semiconductor device 200 taken along line a-a (the X axis) of FIG. 8A. In some embodiment, the dummy stacks 230-1 and 230-2 are spatially apart from each other. More specifically, the dummy stack 230-1 overlays a central portion 231-1 of the left upper fin 218-1 with a respective central portion of the oxide layer 222 being sandwiched therebetween, which is herein referred to as "left dummy stack 230-1;" and the dummy stack 230-2 overlays a central portion 231-2 of the right upper fin 218-2 with a respective central portion of the oxide layer 222 being sandwiched therebetween, which is herein referred to as "right dummy stack 230-1."

As mentioned above, the semiconductor device 200 includes at least two FinFETs. According to some embodiments, the central portion 231-1 of the left upper fin 218-1, overlaid by the left dummy stack 230-1, may serve as a respective conduction channel of one the at least two FinFETs; and the central portion 231-2 of the right upper fin 218-2, overlaid by the right dummy stack 230-2, may serve as a respective conduction channel of the other one of the at least two FinFETs, which will be discussed below. Further, the portions at the respective sides of the overlaid central portion of the left and right upper fins 218-1 and 218-2 (e.g., side portions 233-1 and 233-2 as shown in FIG. 8A), which are only overlaid by the oxide layer 222 in FIG. 8A, may be partially overlaid by spacers and partially removed to formed as respective source/drain features in the following processing steps, which will also be discussed below.

In some embodiments, the left and right dummy stacks 230-1 and 230-2 may each comprise a polysilicon material. Further, each of the left and right dummy stacks 230-1 and 230-2 may be a polysilicon material doped with a uniform or non-uniform doping concentration. The left and right dummy stacks 230-1 and 230-2 may be formed by performing at least some of the following processes: using a suitable process such as ALD, CVD, physical vapor deposition (PVD), plating, or combinations thereof to deposit the above-described polysilicon material over the left and right upper fins 218-1 and 218-2 (with the respective oxide layer 222 disposed therebetween); and using at least one wet and/or dry etching process to respectively define the left and right dummy stacks 230-1 and 230-2.

Figure 9A:
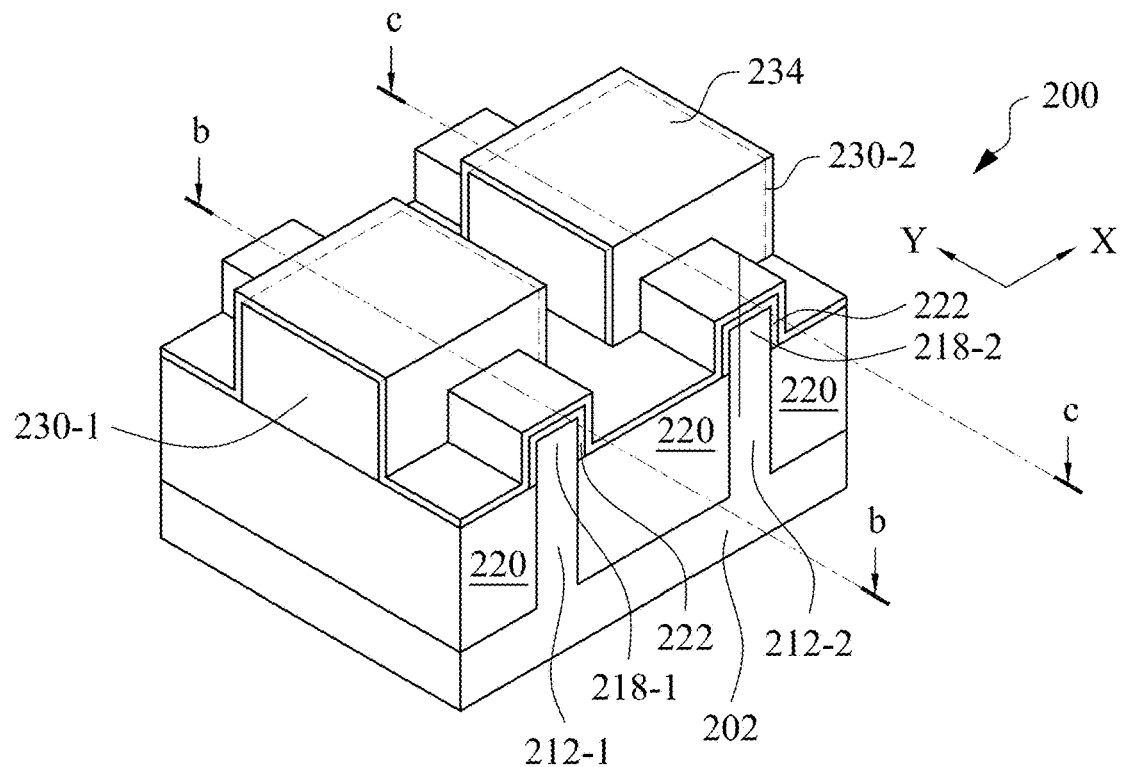
Figure 9B:
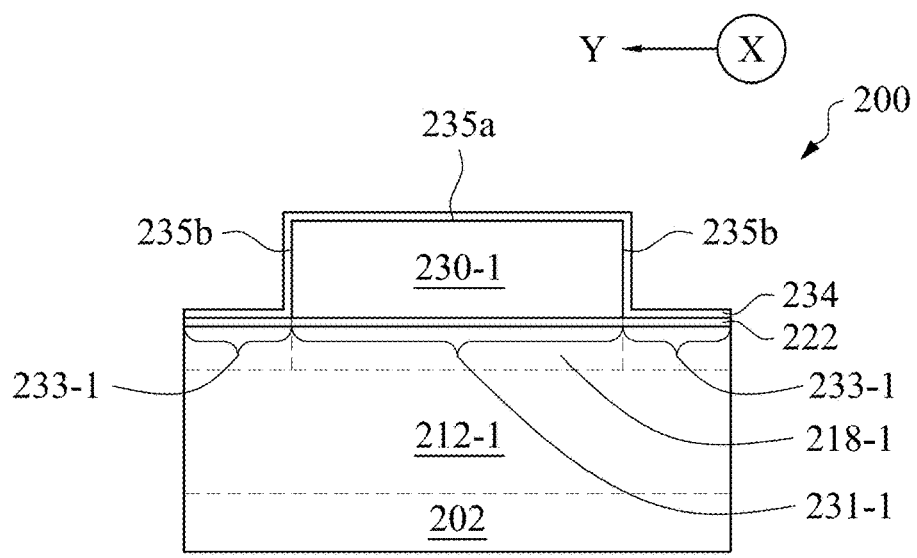
Figure 9C:
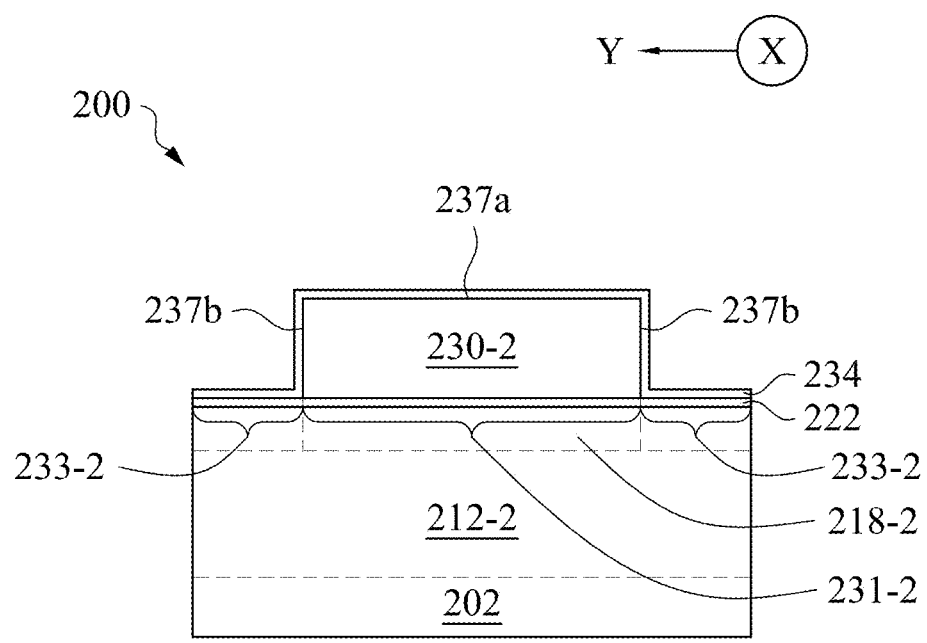

Corresponding to operation 116 of FIG. 1B, FIG. 9A is a perspective view of the semiconductor device 200 including a first spacer dielectric layer 234, which is formed at one of the various stages of fabrication, according to some embodiments, and FIGS. 9B and 9C are cross-sectional views of the semiconductor device 200 respectively taken along line b-b and line c-c (the Y axis) of FIG. 9A. In some embodiments, the first spacer dielectric layer 234 is substantially thin and conformal such that the first spacer dielectric layer 234 can follow respective geometric profiles of the left and right dummy stacks 230-1 and 230-2, which can be better seen in the cross-sectional views of FIGS. 9B and 9C.

In FIG. 9B, the first spacer dielectric layer 234 overlays a top boundary 235a of the left dummy stack 230-1 and extends along sidewalls 235b of the left dummy stack 230-1. As mentioned above in FIG. 8A, the central portion 231-1 of the left upper fin 218-1 is overlaid by the left dummy stack 230-1 with the oxide layer 222 disposed therebetween, and the side portions 233-1 (at the sides of the central portion 231-1 when extending parallel to the Y axis) are only overlaid by the oxide layer 222. In some embodiments, the first spacer dielectric layer 234 may further overlay the side portions 233-1 with the oxide layer 222 disposed therebetween. Similarly, in FIG. 9C, the integrally formed first spacer dielectric layer 234 overlays a top boundary 237a of the right dummy stack 230-2 and extends along sidewalls 237b of the right dummy stack 230-2. As mentioned above, the central portion 233-1 of the right upper fin 218-2 is overlaid by the right dummy stack 230-2 with the oxide layer 222 disposed therebetween, and the side portions 233-2 (at the sides of the central portion 233-1 when extending parallel to the Y axis) are only overlaid by the oxide layer 222. In some embodiments, the first spacer dielectric layer 234 may further overlay the side portions 233-2 with the oxide layer 222 disposed therebetween.

In some embodiments, the first spacer dielectric layer 234 may include silicon oxide (SiO), silicon nitride (SiN), silicon oxynitride (SiON), silicon oxycarbonitride (SiOCN), or other suitable material. In some embodiments, the first spacer dielectric layer 234 may be formed by depositing at least one of the above-mentioned materials over the left and right dummy stacks 230-1 and 230-2 (and the oxide layer 222) using CVD, PVD, ALD, or other suitable techniques.

Figure 10A:
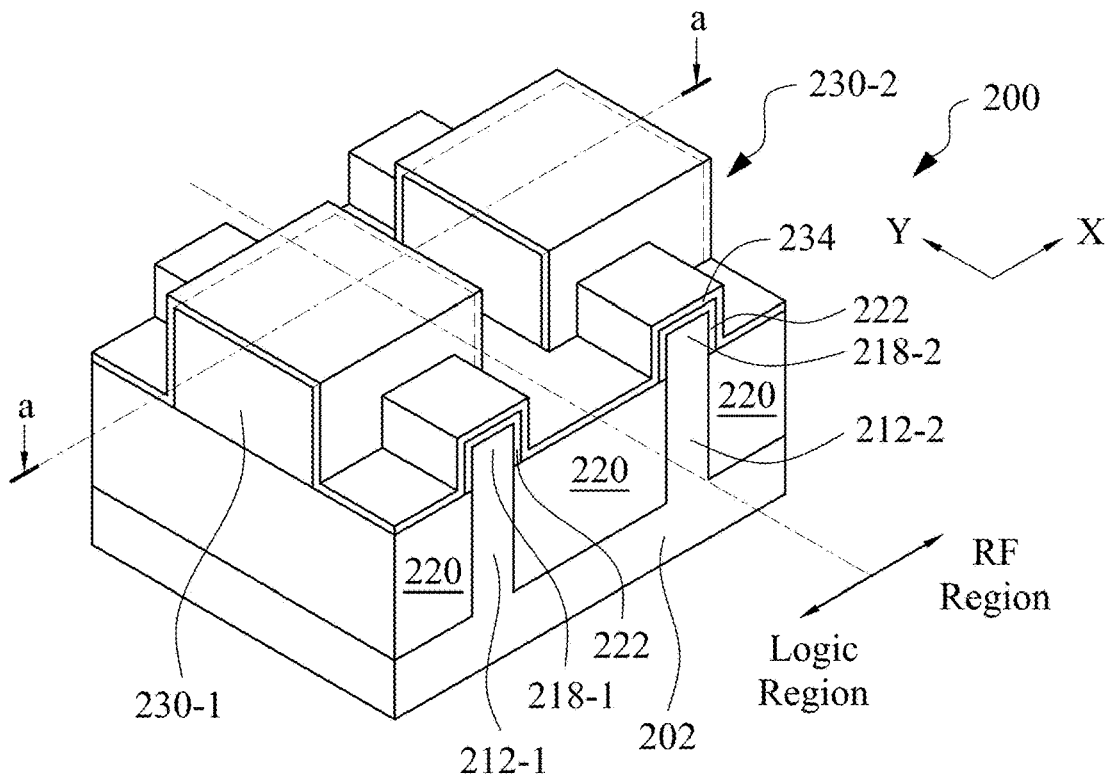
Figure 10B:
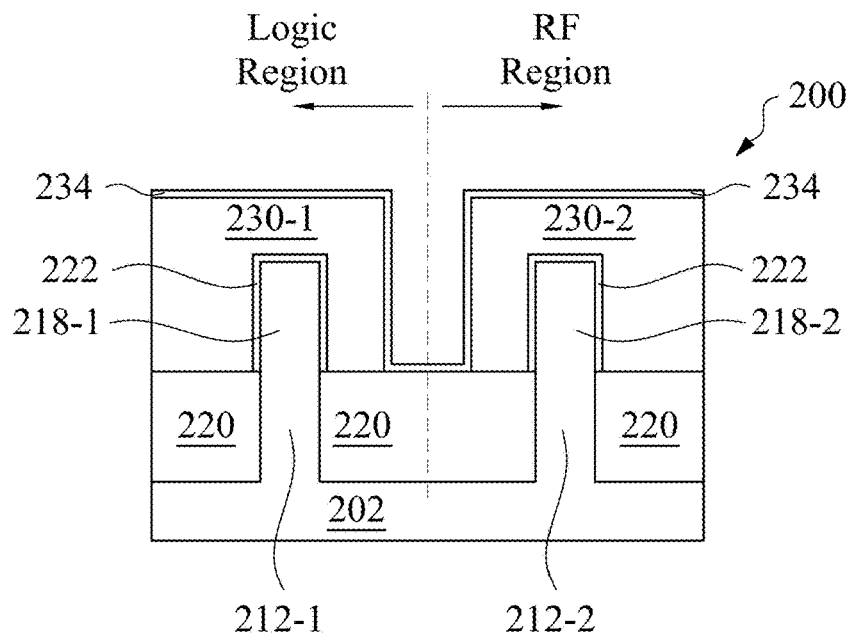

Corresponding to operation 118 of FIG. 1B, FIG. 10A is a perspective view of the semiconductor device 200 in which respective logic and RF regions over the substrate 202 are identified at one of the various stages of fabrication, according to some embodiments, and FIG. 10B is a cross-sectional view of the semiconductor device 200 taken along line a-a (the X axis) of FIG. 10A. As mentioned above, the semiconductor device 200 includes at least two FinFETs, one of which is configured to be used as a logic gate device and the other of which is configured to be used as an RF transistor. In this regard, the substrate 202 is divided into the logic region where the logic gate device is to be formed and the RF region where the RF transistor is to be formed. In the illustrated embodiments of FIGS. 10A and 10B (and the following figures), the left-hand part of the substrate 202, which includes the left fin 212-1, the left upper fin 218-1, and the left dummy stack 230-1, is defined as the logic region; and the right-hand part of the substrate 202, which includes the right fin 212-2, the right upper fin 218-2, and the right dummy stack 230-2, is defined as the RF region. Although the logic and RF regions are spatially apart by the isolation feature 220 (e.g., a shallow trench isolation (STI) feature) in the illustrated embodiments of FIGS. 10A and 10B (and the following figures), it is noted that any of a variety of other features can be formed between the logic and RF regions while remaining within the scope of the present disclosure.

Figure 11A:
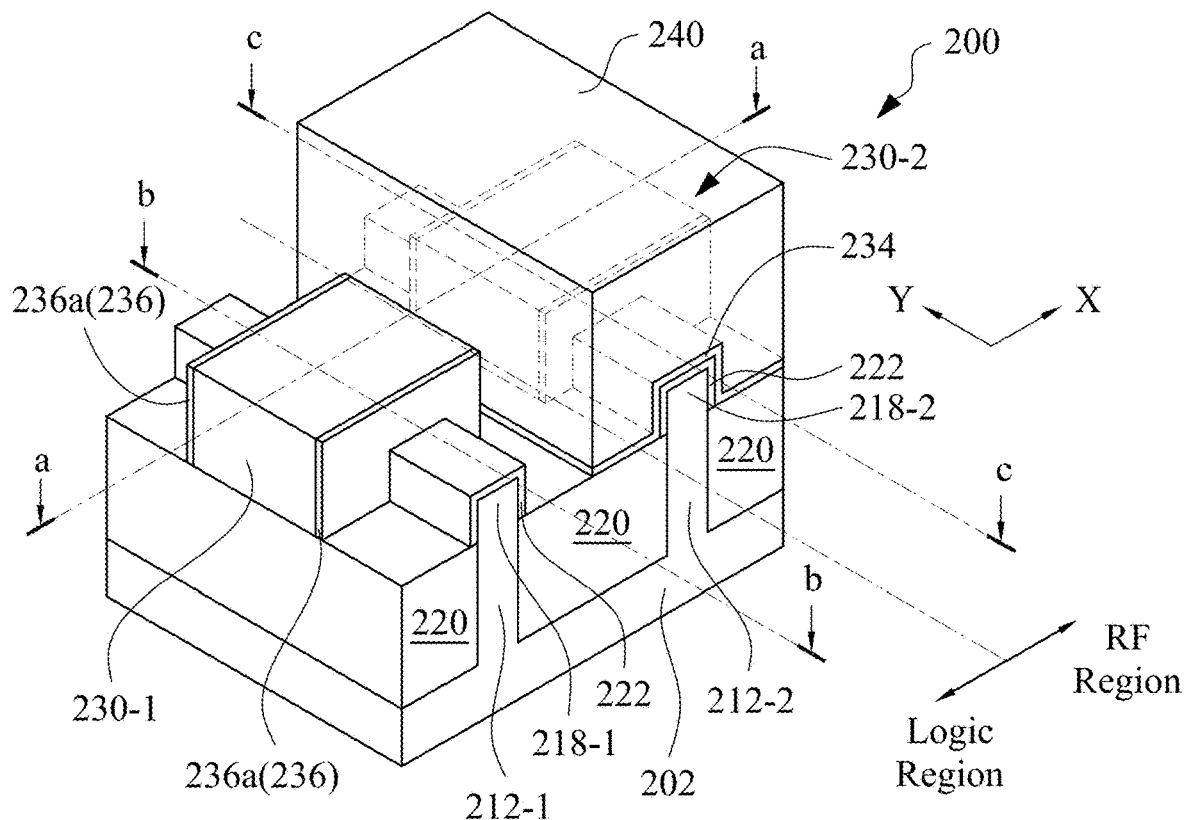
Figure 11B:
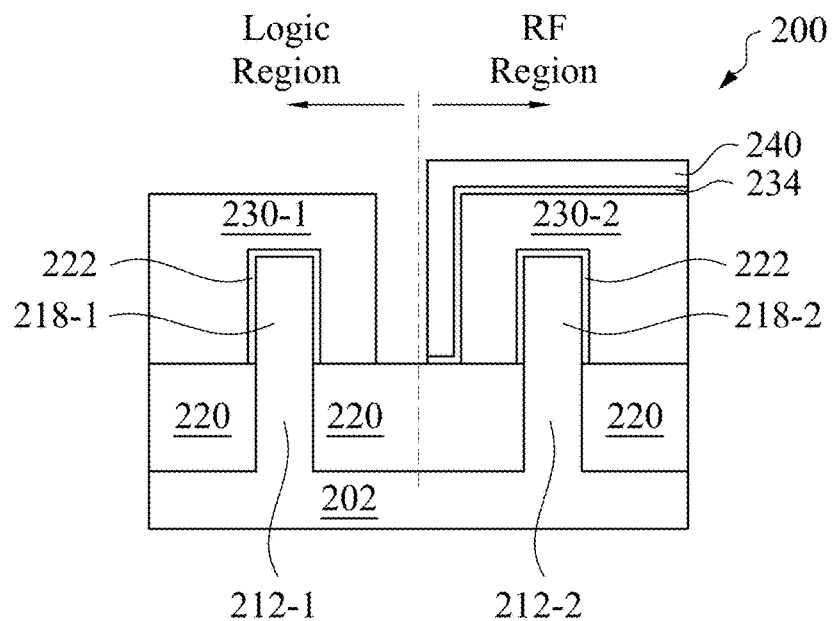
Figure 11C:
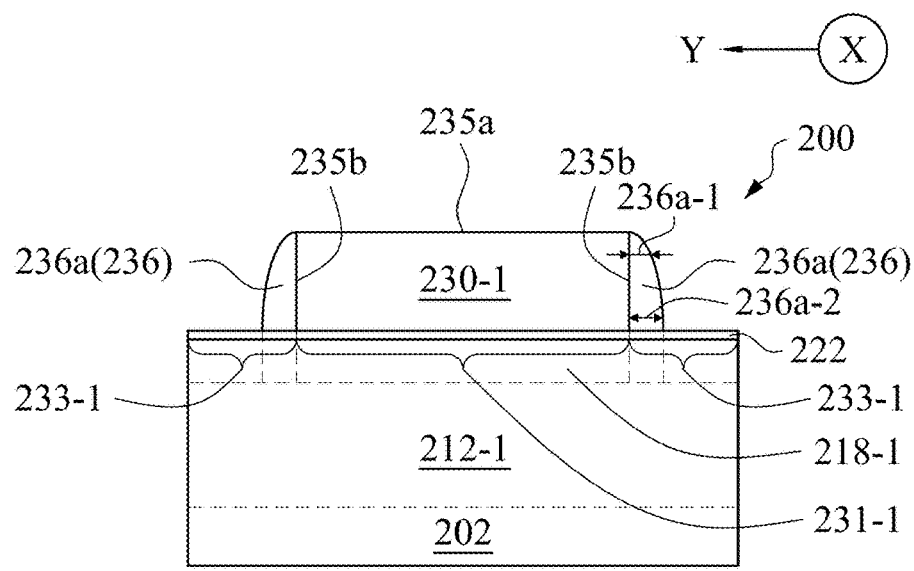
Figure 11D:
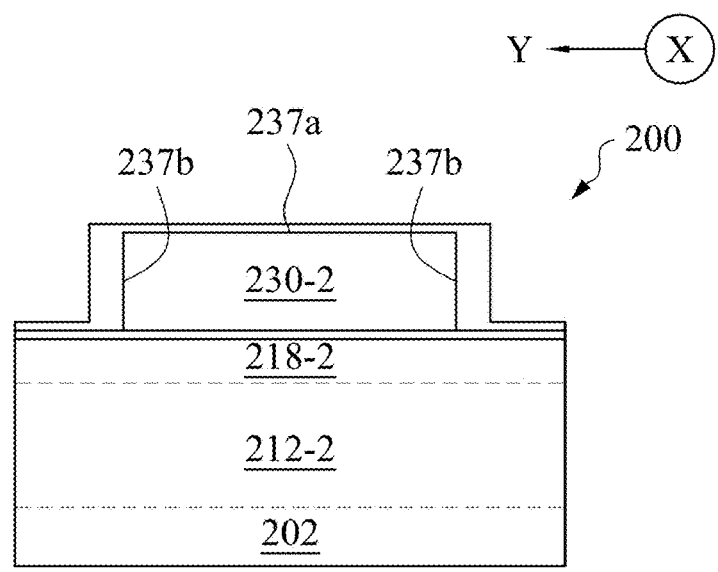

Corresponding to operation 120 of FIG. 1B, FIG. 11A is a perspective view of the semiconductor device 200 including a first portion 236a of a first spacer 236, which is formed at one of the various stages of fabrication, according to some embodiments, FIG. 11B is a cross-sectional view of the semiconductor device 200 taken along line a-a (the X axis) of FIG. 11A, FIG. 11C is a cross-sectional view of the semiconductor device 200 taken along line b-b (the Y axis) of FIG. 11A, and FIG. 11D is a cross-sectional view of the semiconductor device 200 taken along line c-c (the Y axis) of FIG. 11A.

In some embodiments, the first portion 236a of the first spacer 236 is formed by performing at least one dry and/or wet etching process on the first spacer dielectric layer 234 in the logic region while the RF region is covered by a patternable layer 240 (e.g., a hardmask layer, a photoresist layer, etc.), as illustrated in FIGS. 11A and 11B. As such, the first portion 236a of the first spacer 236, which is a remaining portion of the first spacer dielectric layer 234 after the at least one dry and/or wet etching process, extends along the sidewall 235b of the left dummy stack 230-1 in the logic region (as illustrated in FIGS. 11A and 11C) while in the RF region (as illustrated in FIG. 11D), the first spacer dielectric layer 234 remains intact (i.e., still overlaying the top boundary 237a and extending along the sidewalls 237b). Further, in some embodiments, after the at least one dry and/or wet etching process, the first portion 236a of the first spacer 236 may have a thickness substantially thinner than the original thickness of the first spacer dielectric layer 234, or substantially close to zero (i.e., no presence of such a first portion 236a of the first spacer 236), as mentioned above. To be consistent, mainly the embodiments about the presence of the first portion 236a of the first spacer 236 are described in the following discussions. In some embodiments, after the first portion 236a of the first spacer 236 is formed, the patternable layer 240 is removed.

Referring again to FIG. 11C, in some embodiments, the first portion 236a of the first spacer 236 has two layers that respectively extend along the sidewalls 235b of the left dummy stack 230-1 in the logic region, wherein such two layers may further extend from the sidewalls 235b toward opposite directions of the Y axis, respectively (i.e., extending in parallel with the left fin 212-1 and left upper fin 218-1). That is, one of the two layers extends to the left along the Y direction, while the other one of the two layers extends to the right along the −Y direction. Accordingly, the two layers of the first portion 236a of the first spacer 236 respectively overlay part of the side portions 233-1 (with the oxide layer 222 disposed therebetween) that are immediately adjacent to the central portion 231-1, as shown. Further, due to the at least one dry and/or wet etching process, each of the two layers may laterally extend unevenly (e.g., rounded upper edge). For example, a respective upper portion of each layer laterally extends less farther from the sidewall 235b (with a distance 236a-1) and a respective lower portion of that layer laterally extends more farther from the sidewall 235b (with a distance 236a-2), wherein the distance 236a-2 is greater than the distance 236a-1.

Figure 12A:
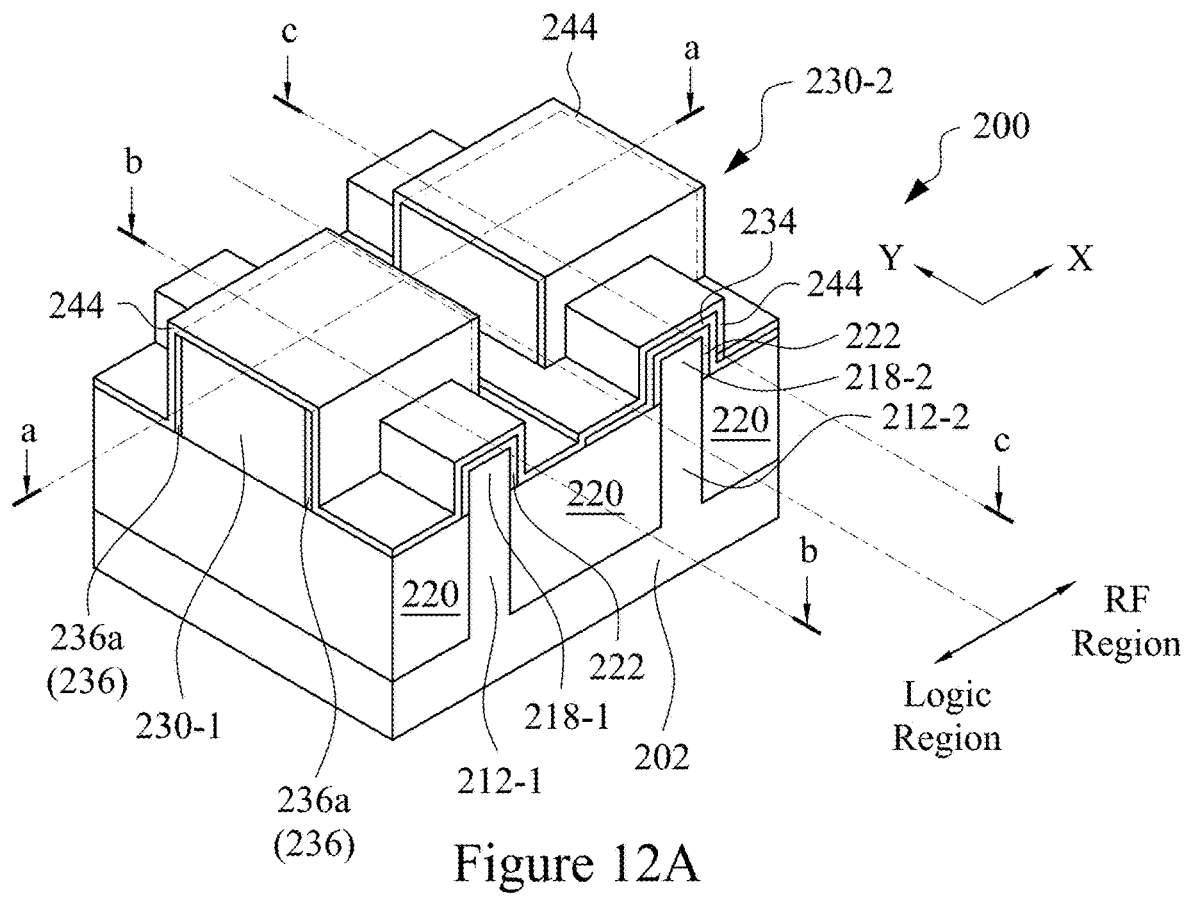
Figure 12B:
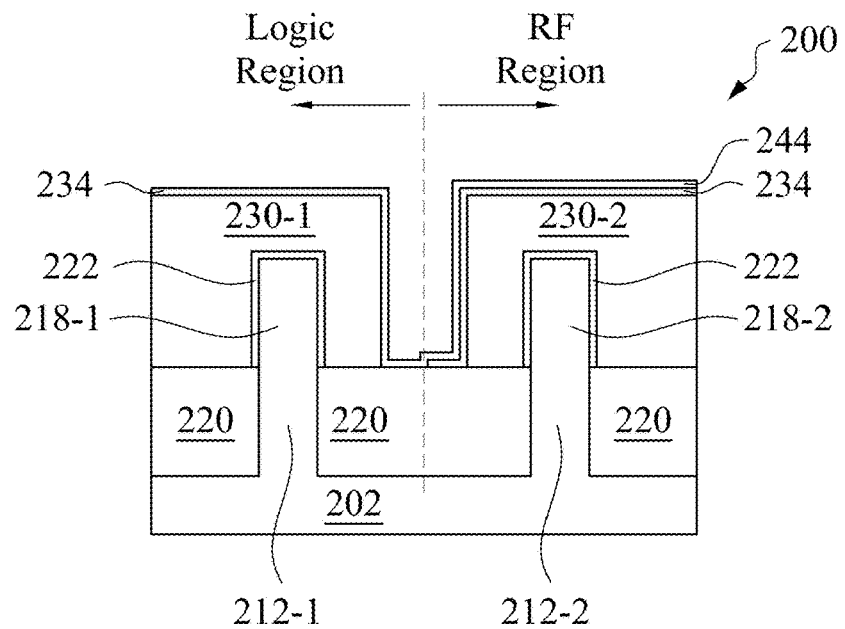
Figure 12C:
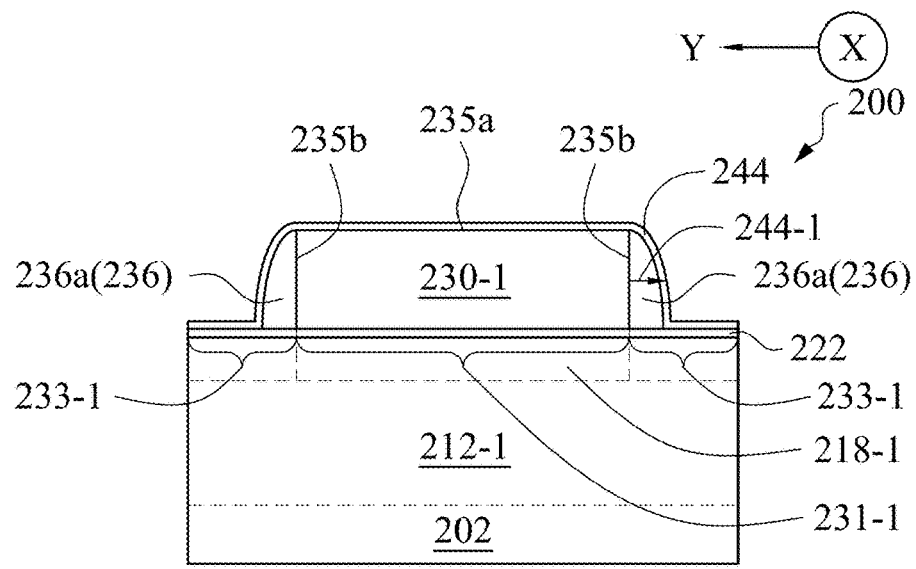
Figure 12D:
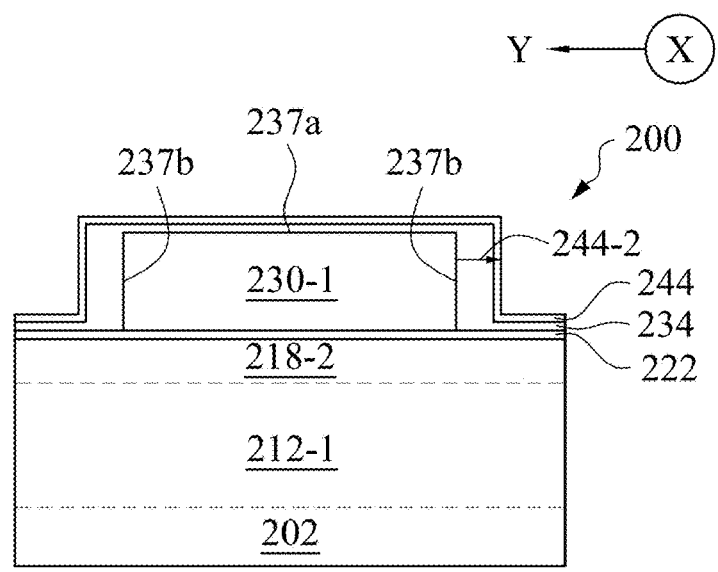

Corresponding to operation 122 of FIG. 1B, FIG. 12A is a perspective view of the semiconductor device 200 including a second spacer dielectric layer 244, which is formed at one of the various stages of fabrication, according to some embodiments, FIG. 12B is a cross-sectional view of the semiconductor device 200 taken along line a-a (the X axis) of FIG. 12A, FIG. 12C is a cross-sectional view of the semiconductor device 200 taken along line b-b (the Y axis) of FIG. 12A, and FIG. 12D is a cross-sectional view of the semiconductor device 200 taken along line c-c (the Y axis) of FIG. 12A. As shown in FIGS. 12A and 12B, the second spacer dielectric layer 244 is formed to overlay both the logic and RF regions. More specifically, according to some embodiments, the second spacer dielectric layer 244 is substantially thin and conformal such that the second spacer dielectric layer 244 can follow respective geometric profiles of the left and right dummy stacks 230-1 (with the first portion 236a of the first spacer 236 disposed therebetween) and 230-2 (with the first and second spacer dielectric layers 234 and 244 collectively disposed therebetween), which can be better seen in the cross-sectional view of FIGS. 12C and 12D.

In FIG. 12C where the logic region is shown, the second spacer dielectric layer 244, which is integrally formed, overlays the top boundary 235a of the left dummy stack 230-1 and extends along sidewalls of the first portion 236a of the first spacer 236. Further, the second spacer dielectric layer 244 may overlay part of the side portions 233-1 with the oxide layer 222 disposed therebetween. In FIG. 12D where the RF region is shown, the second spacer dielectric layer 244, which is integrally formed over the first spacer dielectric layer 234, extends along the top boundary 237a and the respective sidewalls 237b of the right dummy stack 230-2. Further, the second spacer dielectric layer 244 may overlay part of the side portions 233-2 with the oxide layer 222 disposed therebetween. As mentioned above, in some embodiments, the first portion 236a of the first spacer 236 is substantially thinner than the original thickness of the first spacer dielectric layer 234. Thus, it is understood that a lateral distance 244-1, in the logic region, by which the second spacer dielectric layer 244 extends from the sidewall 235b is substantially shorter than a lateral distance 244-2, in the RF region, by which the second spacer dielectric layer 244 extends from the sidewall 237b.

In some embodiments, the second spacer dielectric layer 244 may include silicon oxide (SiO), silicon nitride (SiN), silicon oxynitride (SiON), silicon oxycarbonitride (SiOCN), or other suitable material. In some embodiments, the second spacer dielectric layer 244 may be formed by using CVD, PVD, ALD, or other suitable techniques to deposit at least one of the above-mentioned materials over the left dummy stack 230-1 with the first portion 236a of the first spacer 236 disposed at the sides of the left dummy stack 230-1 and the right dummy stack 230-2 with the first spacer dielectric layer 234 disposed therebetween.

Figure 13A:
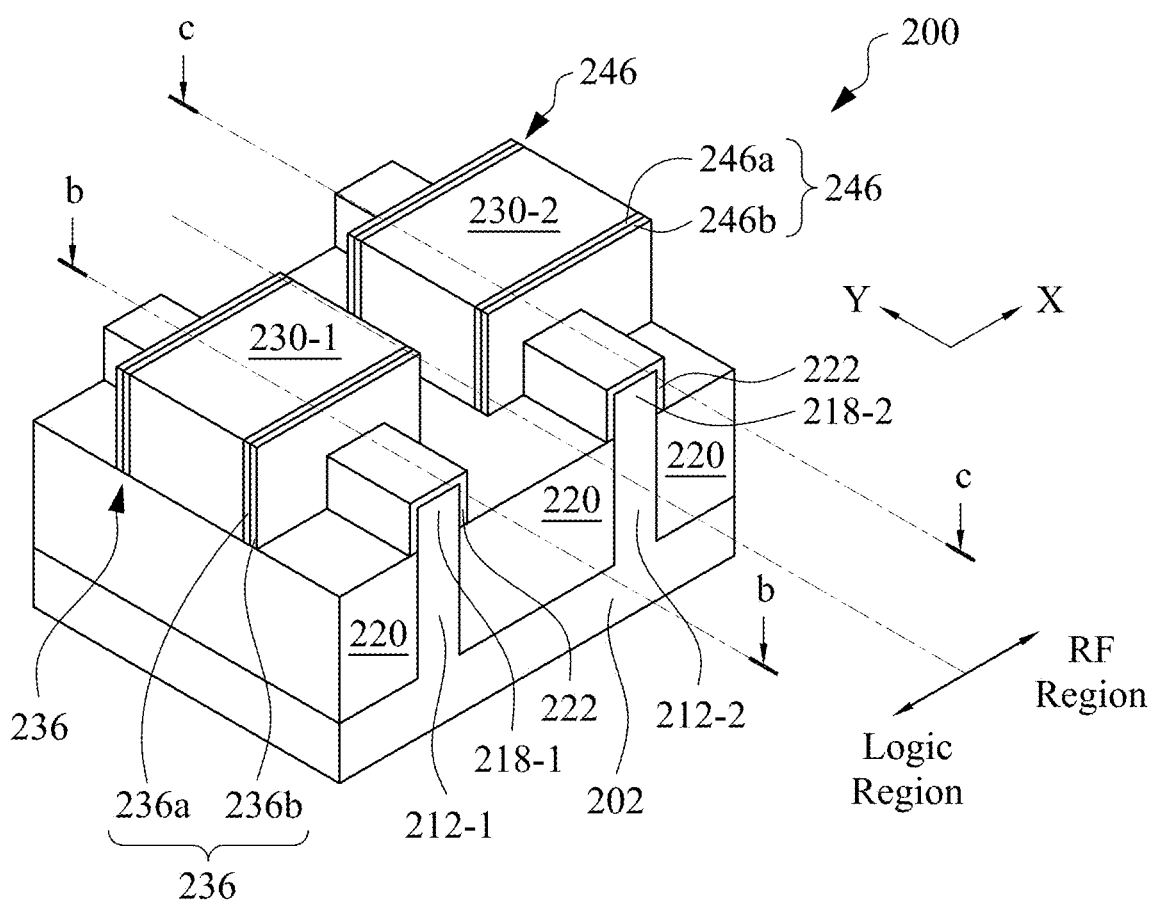
Figure 13B:
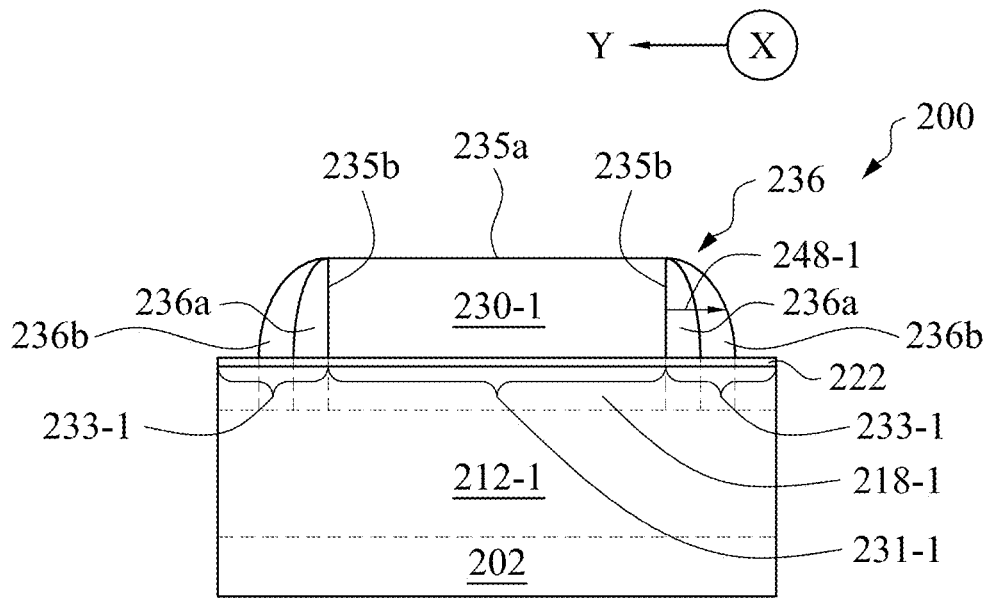
Figure 13C:
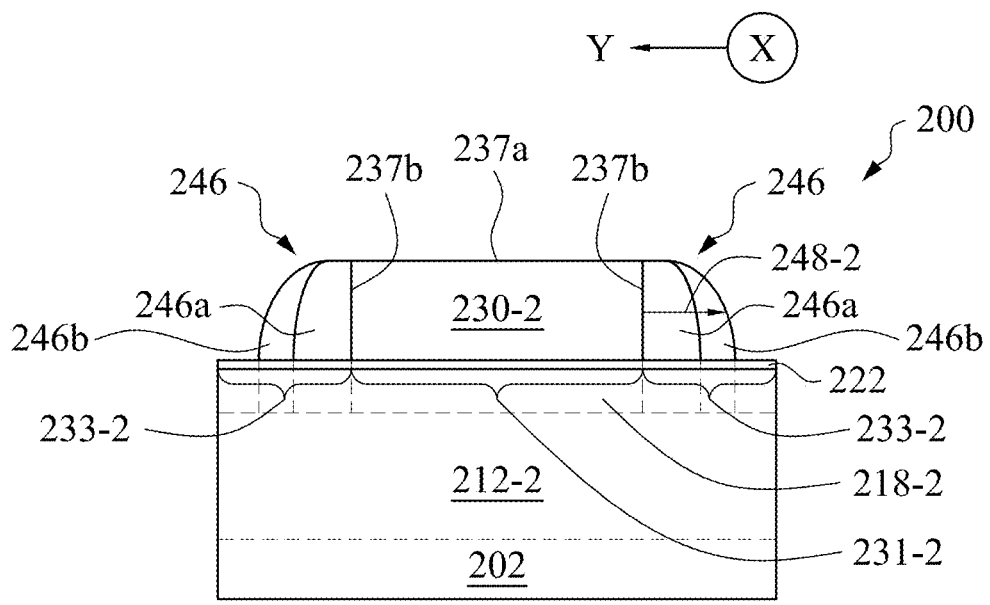

Corresponding to operation 124 of FIG. 1C, FIG. 13A is a perspective view of the semiconductor device 200 including a second portion 236b of the first spacer 236 in the logic region and a second spacer 246 in the RF region, which are formed at one of the various stages of fabrication, according to some embodiments, FIG. 13B is a cross-sectional view of the semiconductor device 200 taken along line b-b (the Y axis) of FIG. 13A, and FIG. 13C is a cross-sectional view of the semiconductor device 200 taken along line c-c (the Y axis) of FIG. 13A. As respectively shown in the FIGS. 13B and 13C, in the logic region, the second portion 236b of the first spacer 236 extends along the sidewall of the first portion 236a; and in the RF region, the second spacer 246 includes respective first and second portions 246a and 246b, each of which extends along the sidewall 237b of the right dummy stack 230-2. In some embodiments, the first and second portions 246a and 246b are remaining portions of the first and second spacer dielectric layers 234 and 244, respectively, which will be discussed below.

In some embodiments, the first spacer 236 (including the second portion 236b) and the second spacer 246 are formed by concurrently performing at least one dry and/or wet etching process on the second spacer dielectric layer 244 in the logic region and the first and second spacer dielectric layers 234 and 244 in the RF region. More specifically, in the logic region, the first portion 236a of the first spacer 236 may remain substantially intact during the concurrent etching process that is mostly applied on the second spacer dielectric layer 244. As such, the thickness of the first portion 236a of the first spacer 236 may remain substantially unchanged. In the RF region, the first portion 246a of the second spacer 246 may remain substantially intact during the concurrent etching process that is mostly applied on the second spacer dielectric layer 244 such that the thickness of the first portion 246a of the second spacer 246 may remain substantially unchanged (i.e., the original thickness of the first spacer dielectric layer 234).

Further, as described above with respect to FIGS. 12C and 12D, the lateral distance 244-1 in the logic region is substantially shorter than the lateral distance 244-2 because the first portion 236a of the first spacer 236 is substantially thinner than the original thickness of the first spacer dielectric layer 234. Accordingly, after the at least one concurrent dry and/or wet etching process in which the respective thicknesses of the first portions 236a of first spacer 236 and of the second spacer 246 remain substantially unchanged, a lateral distance 248-1, in the logic region, by which the first spacer 236 extends from the sidewall 235b is substantially shorter than a lateral distance 248-2, in the RF region, by which the second spacer 246 extends from the sidewall 237b.

In FIG. 13B, according to some embodiments, the second portion 236b of the first spacer 236 has two layers that respectively extend along the sidewalls of the first portion 236a, wherein such two layers may further extend from the sidewalls toward opposite directions of the Y axis, respectively (i.e., extending in parallel with the left fin 212-1 and left upper fin 218-1). Accordingly, the two layers of the second portion 236b of the first spacer 236 respectively overlay part of the side portions 233-1 (with the oxide layer 222 disposed therebetween) that are immediately adjacent to the portion of the left upper fin 218-1 overlaid by the first portion 236a, as shown. In FIG. 13C, the first and second portions 246a and 246b of the second spacer 246 each has two layers that respectively extend along the sidewalls 237b of the right dummy stack 230-2, wherein the two layers of the first portion 246a and the two layers of the second portion 246b may each further extend from the sidewalls 237b toward opposite directions of the Y axis, respectively (i.e., extending in parallel with the right fin 212-2 and right upper fin 218-2). Accordingly, the two layers of the first portion 246a of the second spacer 246 respectively overlay part of the side portions 233-2 (with the oxide layer 222 disposed therebetween) that are immediately adjacent to the central portion 231-2 of the right upper fin 218-2, and the two layers of the second portion 246b of the second spacer 246 respectively overlay part of the side portions 233-2 (with the oxide layer 222 disposed therebetween) that are immediately adjacent to the portion of the right upper fin 218-2 overlaid by the first portion 246a, as shown.

Figure 14A:
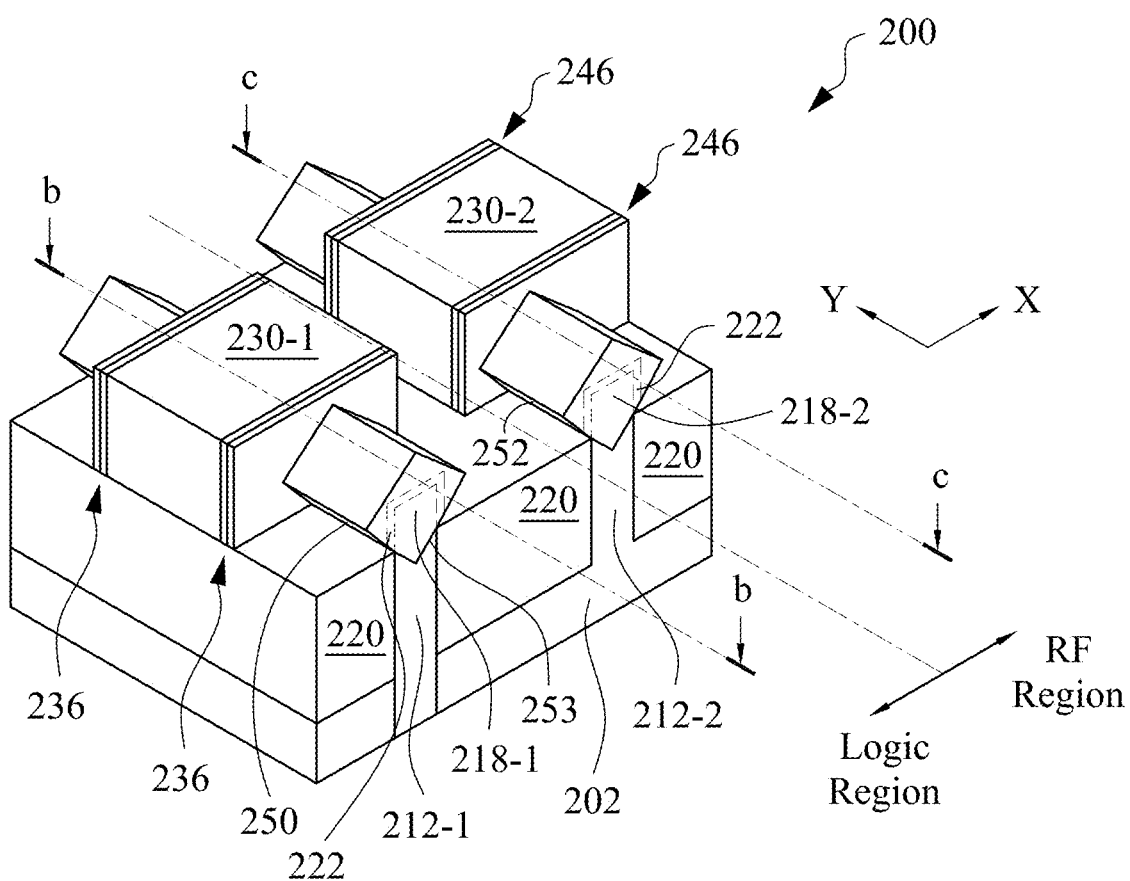
Figure 14B:
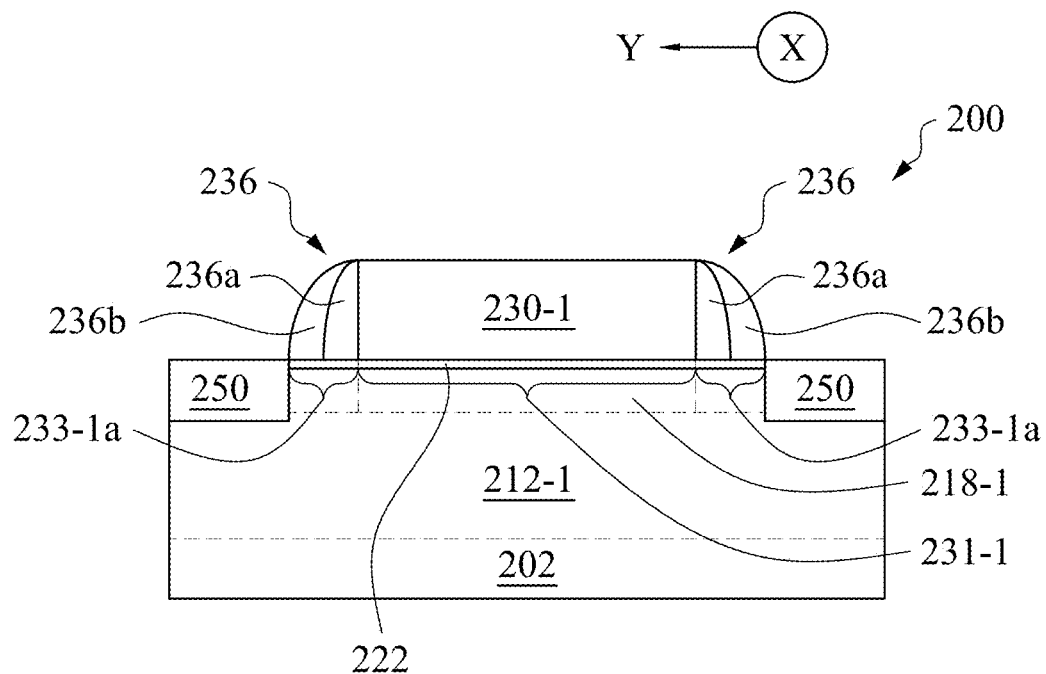
Figure 14C:
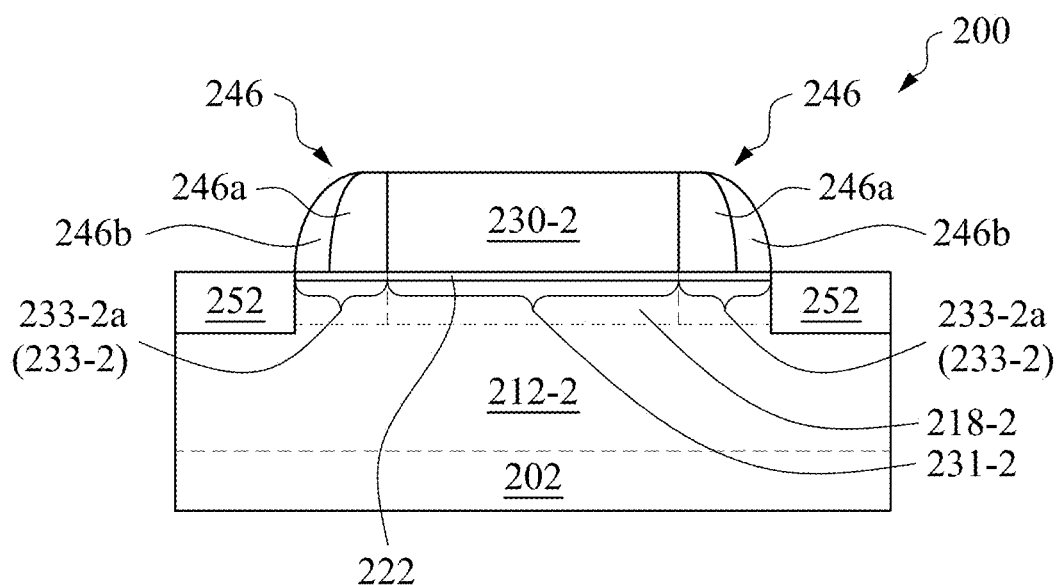

Corresponding to operation 126 of FIG. 1C, FIG. 14A is a perspective view of the semiconductor device 200 including source/drain features 250 formed in the logic region and source/drain features 252 formed in the RF region at one of the various stages of fabrication, according to some embodiments, FIG. 14B is a cross-sectional view of the semiconductor device 200 taken along line b-b (the Y axis) of FIG. 14A, and FIG. 14C is a cross-sectional view of the semiconductor device 200 taken along line c-c (the Y axis) of FIG. 14A. In some embodiments, referring again to FIG. 13B (in the logic region), part of the side portions 233-1 of the left upper fin 218-1, and the overlaying oxide layer 222, that are not covered by the left dummy stack 230-1 and the first spacer 236 are respectively removed (e.g., etched) before the formation of the source/drain features 250. Similarly, in some embodiments, referring again to FIG. 13C (in the RF region), part of the side portions 233-2 the of the right upper fin 218-2, and the overlaying oxide layer 222, that are not covered by the right dummy stack 230-2 and the second spacer 246 are respectively removed (e.g., etched) before the formation of the source/drain features 252. For purposes of clarity, such removed portions are shown in dotted lines, respectively, in FIG. 14A.

To form the source/drain feature 250 in the logic region, in some embodiments, after the removal of the above-described portions, recesses 253 (FIG. 14A) are formed on the sides of the left dummy stack 230-1 and the first spacer 236. In some embodiments, such a recess 237 may be extended downwardly beneath a top boundary 220' of the isolation feature 220. Subsequently, the source/drain features 250 are epitaxially grown from the left fin 212-1 by using a low-pressure chemical vapor deposition (LPCVD) process and/or a metal-organic chemical vapor deposition (MOCVD) process. The formation of the source/drain features 252 in the RF region are similarly formed such that the discussions are not repeated here. Accordingly, the source/drain features 250 are respectively disposed immediately adjacent to remaining portions 233-1a of the side portions 233-1 that are disposed below the first spacer 236, as illustrated in FIG. 14B; and the source/drain features 252 are respectively disposed immediately adjacent to remaining portions 233-2a of the side portions 233-2 that are disposed below the second spacer 246, as illustrated in FIG. 14C.

Figure 15A:
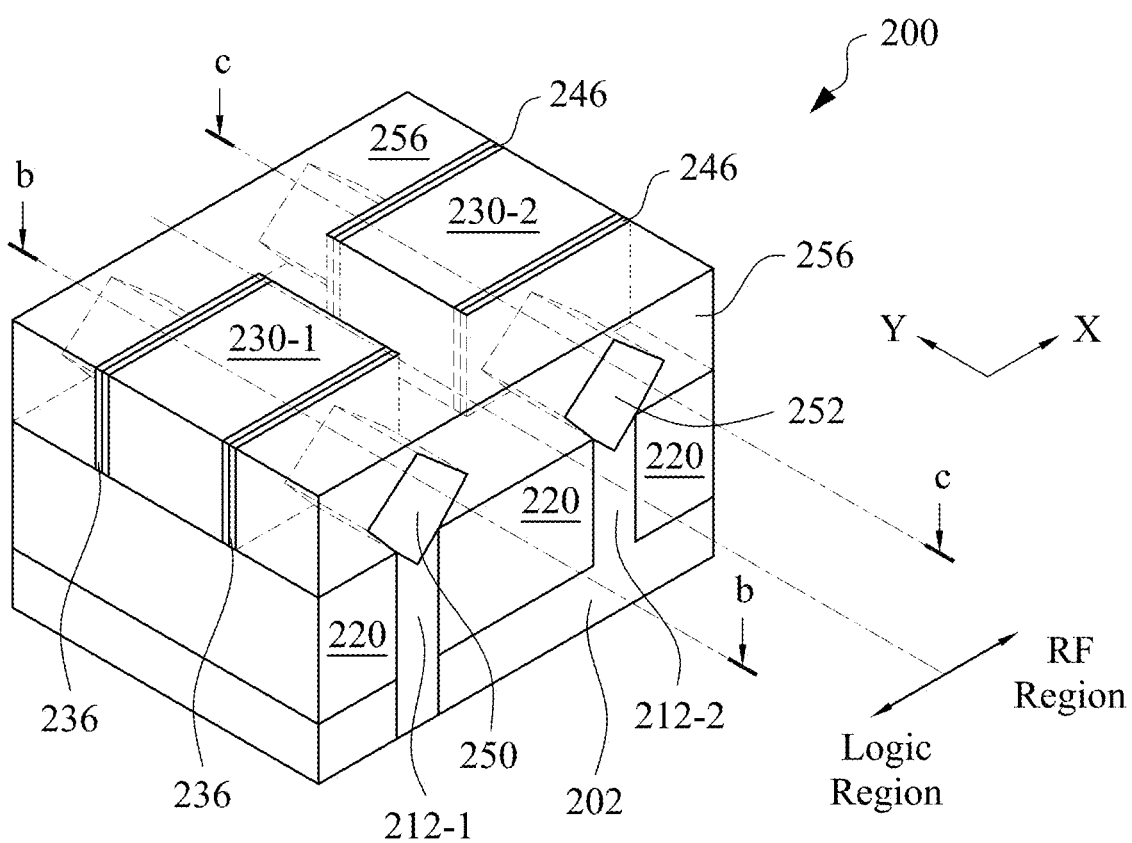
Figure 15B:
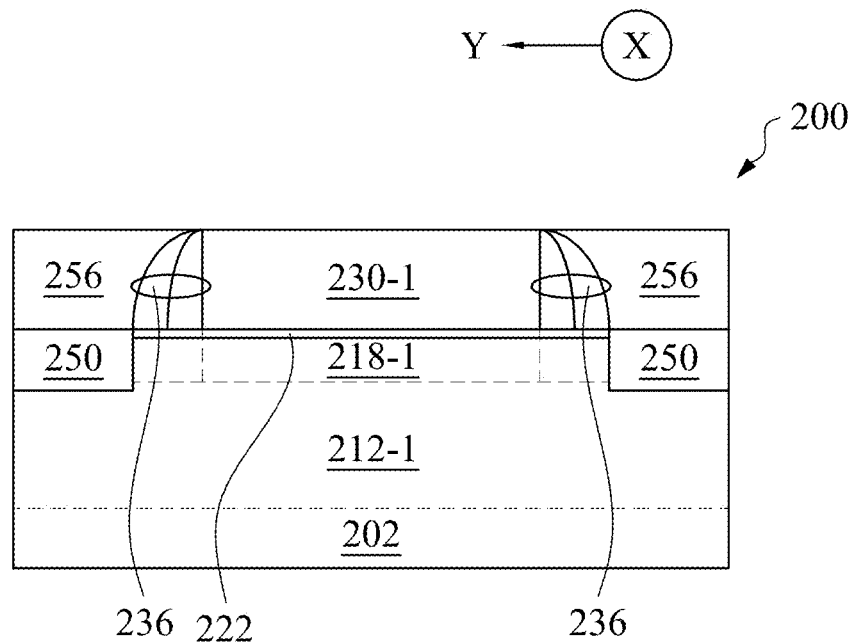
Figure 15C:
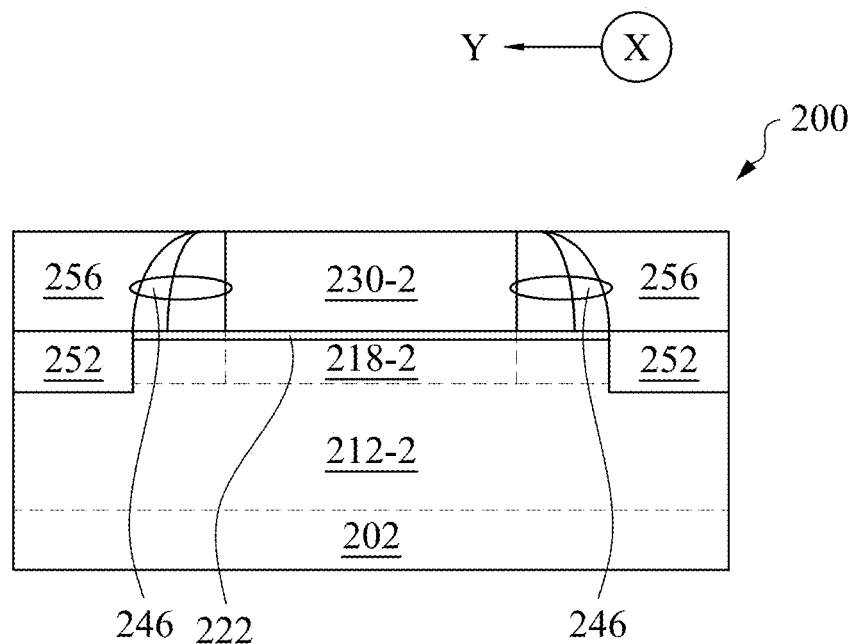

Corresponding to operation 128 of FIG. 1C, FIG. 15A is a perspective view of the semiconductor device 200 including an inter-layer dielectric (ILD) or inter-metal dielectric (IMD) layer 256, which is formed at one of the various stages of fabrication, according to some embodiments, FIG. 15B is a cross-sectional view of the semiconductor device 200 taken along line b-b (the Y axis) of FIG. 15A, and FIG. 15C is a cross-sectional view of the semiconductor device 200 taken along line c-c (the Y axis) of FIG. 15A. As shown, the ILD or IMD layer 256 is formed over the source/drain features 250 in the logic region and the source/drain features 252 in the RE region so as to protect the formed source/drain features 250/252 in at least some of the subsequent processes. In some embodiments, the ILD or IMD layer 256 may also fill a space between the left and right dummy stacks 230-1 and 230-2, as shown in FIG. 15A.

In some embodiments, the ILD or IMD layer 256 may include a dielectric material that is selected from at least one of: silicon oxide, a low dielectric constant (low-k) material, or a combination thereof. The low-k material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials.

Figure 16A:
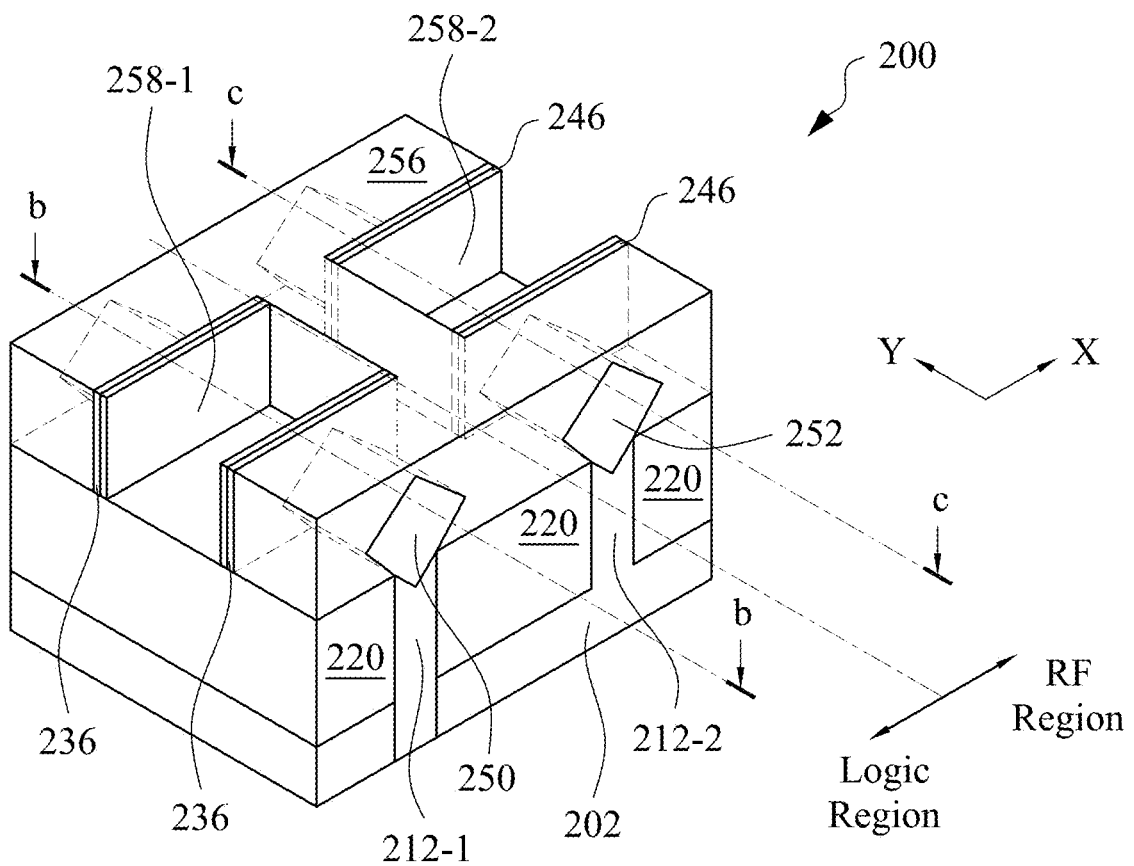
Figure 16B:
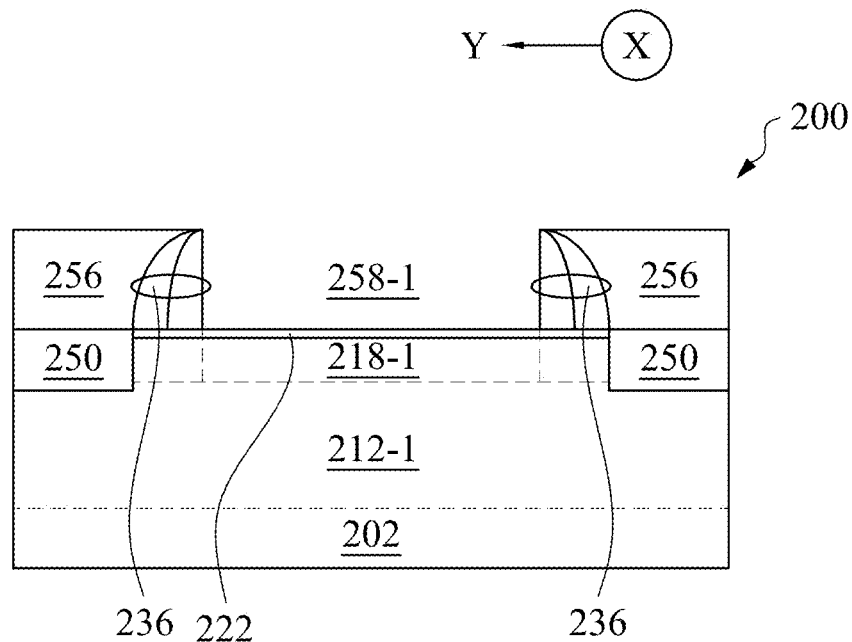
Figure 16C:
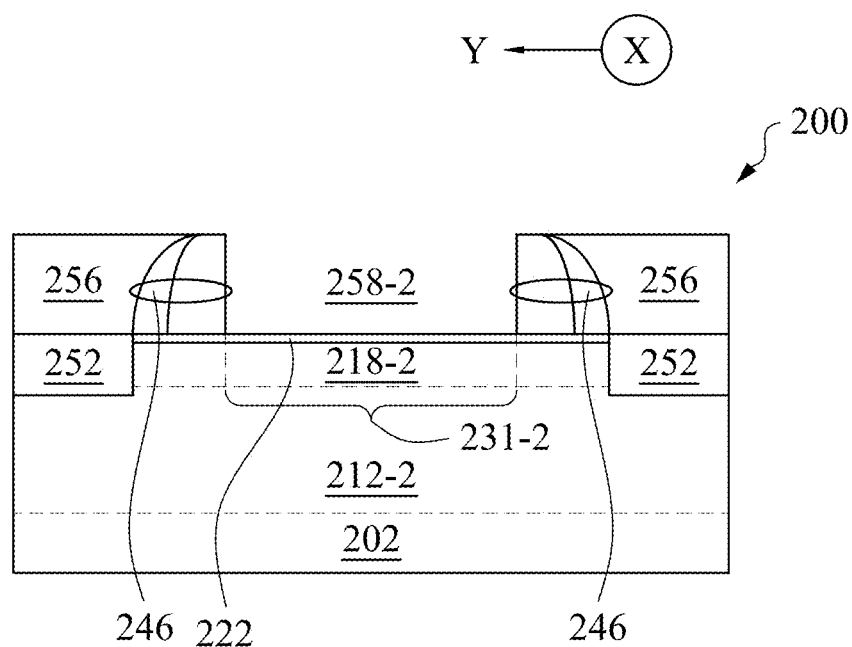

Corresponding to operation 130 of FIG. 1C, FIG. 16A is a perspective view of the semiconductor device 200 including a void 258-1 formed in the logic region and a void 258-2 formed in the RF region at one of the various stages of fabrication, according to some embodiments, FIG. 16B is a cross-sectional view of the semiconductor device 200 taken along line b-b (the Y axis) of FIG. 16A, and FIG. 16C is a cross-sectional view of the semiconductor device 200 taken along line c-c (the Y axis) of FIG. 16A.

In some embodiments, the void 258-1 is formed by removing (e.g., etching) the left dummy stack 230-1 (FIG. 15B), and respectively or concurrently, the void 258-2 is formed by removing (e.g., etching) the right dummy stack 230-2 (FIG. 15C). During the removal of the left and right dummy stacks 230-1 and 230-2, the first and second spacers 236 and 246 may remain intact. In some embodiments, either a wet or dry etching process may be used to remove the left and right dummy stacks 230-1 and 230-2. The wet etching process includes using diluted hydrofluoric acid (DHF), and/or an amine derivative etchant (e.g., $NH_4OH$, NH₃(CH₃)OH, TetraMethyl Ammonium Hydroxide (TMAH), etc.); and the dry etching process includes using a plasma of reactive gas that is selected from: fluorocarbons, oxygen, chlorine, boron trichloride, nitrogen, argon, helium, or a combination thereof. After the removal of the left and right dummy stacks 230-1 and 230-2, the portions of the oxide layer 220 that respectively overlay the central portion 231-1 of the left upper fin 218-1 and central portion 231-2 of the right upper fin 218-2 are exposed, as shown in FIGS. 16B and 16C. In some other embodiments, such portions of the oxide layer 220 may be optionally removed, concurrently or subsequently, with the removal of the left and right dummy stacks 230-1 and 230-2.

Figure 17A:
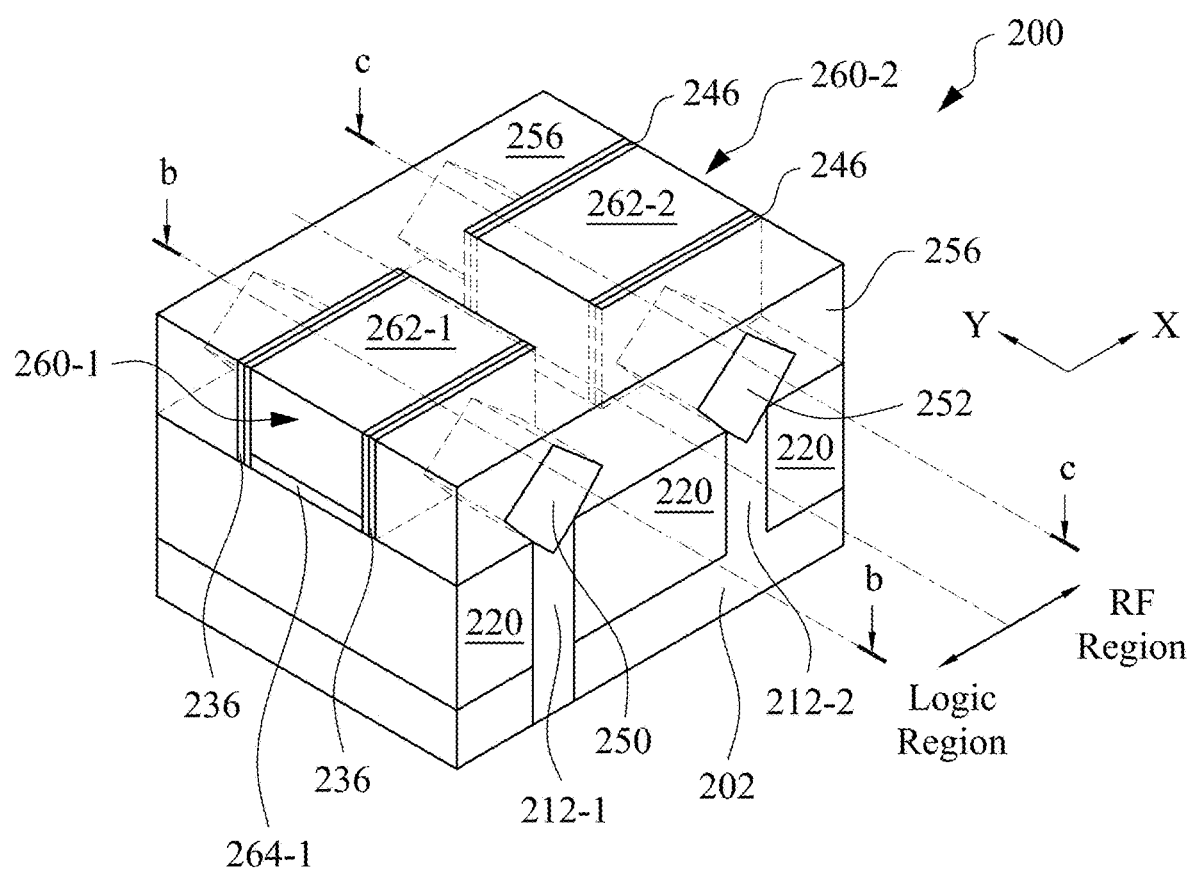
Figure 17B:
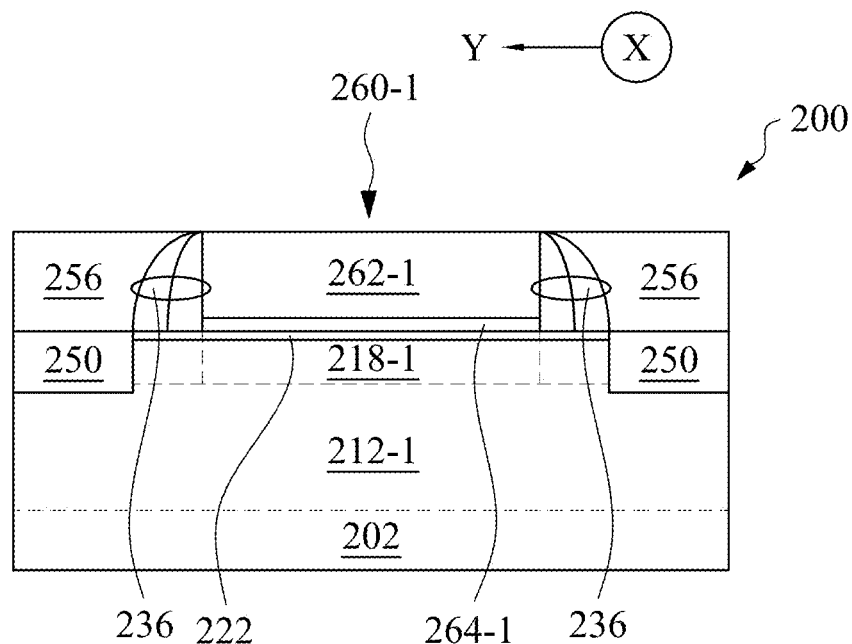
Figure 17C:
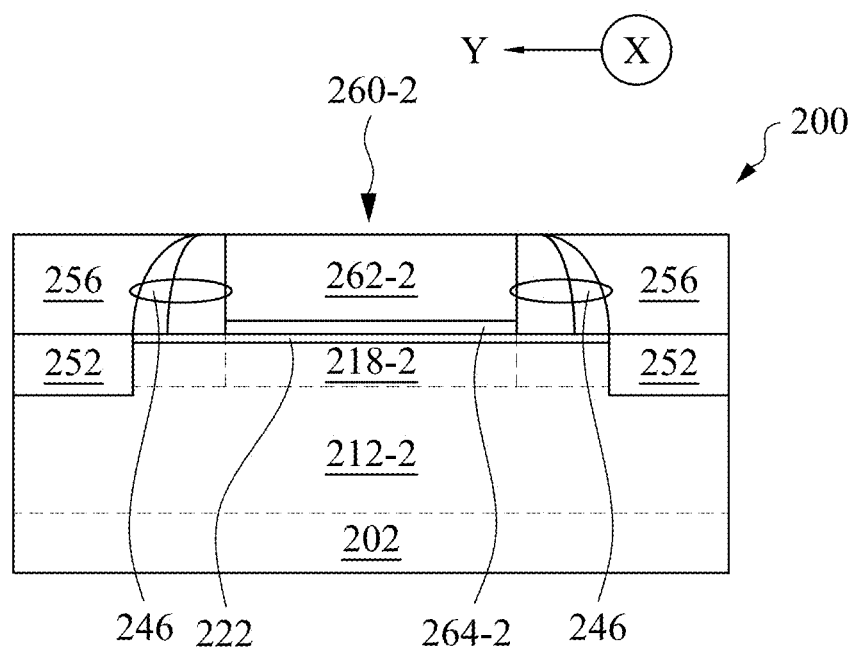

Corresponding to operation 132 of FIG. 1C, FIG. 17A is a perspective view of the semiconductor device 200 including a gate feature 260-1 formed in the logic region and a gate feature 260-2 formed in the RF region at one of the various stages of fabrication, according to some embodiments, FIG. 17B is a cross-sectional view of the semiconductor device 200 taken along line b-b (the Y axis) of FIG. 17A, and FIG. 17C is a cross-sectional view of the semiconductor device 200 taken along line c-c (the Y axis) of FIG. 17A. In some embodiments, the gate feature 260-1 "replaces" the left dummy stack 230-1 (FIG. 15B) by filling the void 258-1 (FIG. 16B); and the gate feature 260-2 "replaces" the right dummy stack 230-2 (FIG. 15C) by filling the void 258-2 (FIG. 16B). Accordingly, the respective sidewalls of the left dummy stack 230-1 then become the sidewalls of the gate feature 260-1; and the respective sidewalls of the right dummy stack 230-2 then become the sidewalls of the gate feature 260-2. In some embodiments, the gate feature 260-1 includes a gate electrode 262-1 and a high-k dielectric layer 264-1 overlaid by the gate electrode 262-1; and the gate feature 260-2 includes a gate electrode 262-2 and a high-k dielectric layer 264-2 overlaid by the gate electrode 262-2, as better seen in the cross-sectional views of FIGS. 17B and 17C.

In some embodiments, the high-k dielectric layers 264-1 and 264-2 each includes a material with a "k" value (dielectric constant) greater than about 4.0, or even greater than about 7.0. In such embodiments, the high-k dielectric layers 264-1 and 264-2 may be each formed of at least one material selected from: Al₂O₃, HfAlO, HfAlON, AlZrO, HfO₂, HfSiO$_x$, HfAlO$_x$, HfZrSiO$_x$, HfSiON, LaAlO₃, ZrO₂, or a combination thereof. The high-k dielectric layers 264-1 and 264-2 may be formed using a suitable process such as ALD, CVD, PVD, plating, or combinations thereof to overlay the central portion 231-1 of the left upper fin 218-1 (with the oxide layer 222 disposed thereover) and the central portion 231-2 of the right upper fin 218-2 (with the oxide layer 222 disposed thereover), respectively.

In some embodiments, the gate electrodes 262-1 and 262-2 may each include a metal material such as, for example, Al, Cu, W, Ti, Ta, TiN, TiAl, TiAlN, TaN, NiSi, CoSi, or combinations thereof. In some alternative embodiments, the gate electrodes 262-1 and 262-2 may each include a polysilicon material, wherein the polysilicon material may be doped with a uniform or non-uniform doping concentration. The gate electrodes 262-1 and 262-2 may be formed using a suitable process such as ALD, CVD, PVD, plating, or combination thereof to overlay the central portion 231-1 of the left upper fin 218-1 (with the high-k dielectric layer 264-1 and the oxide layer 222 disposed thereover) and the central portion 231-2 of the right upper fin 218-2, respectively (with the high-k dielectric layer 264-2 and the oxide layer 222 disposed thereover).

Figure 18A:
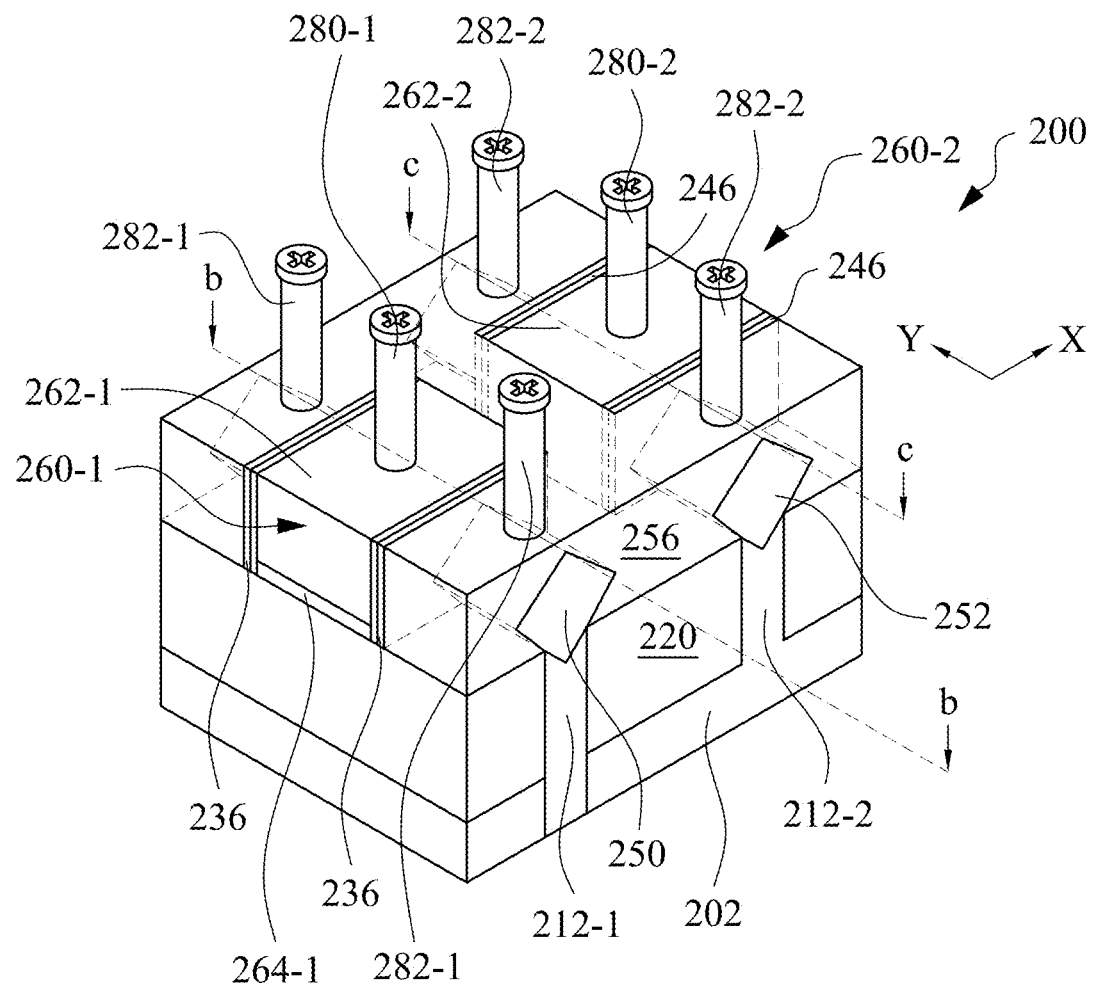
Figure 18B:
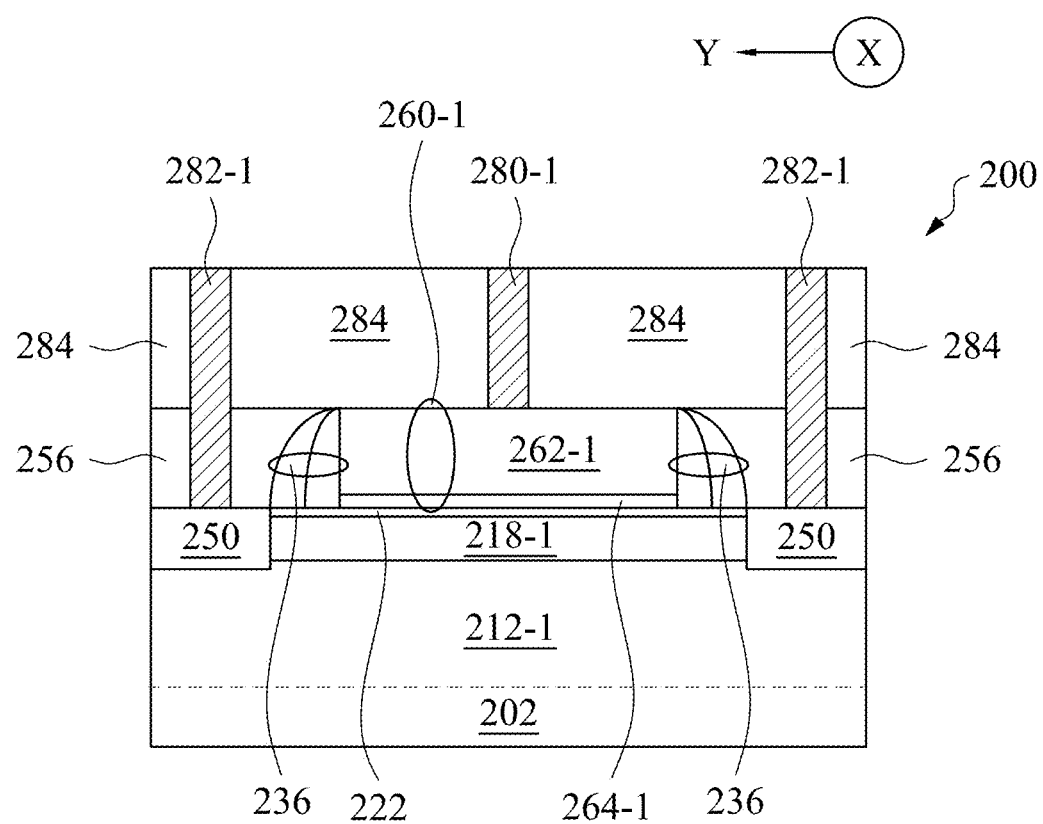
Figure 18C:
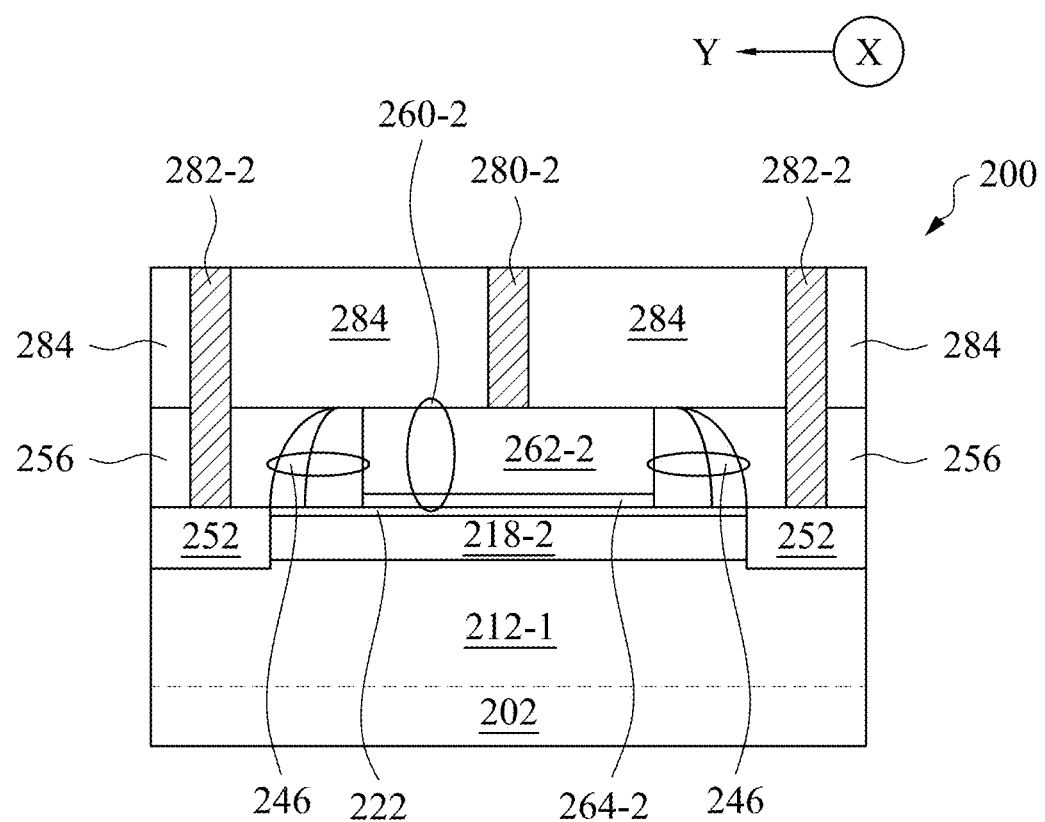

Corresponding to operation 134 of FIG. 1C, FIG. 18A is a perspective view of the semiconductor device 200 including contact plugs 280-1, 282-1, 280-2, and 282-2, which are formed at one of the various stages of fabrication, according to some embodiments, FIG. 18B is a cross-sectional view of the semiconductor device 200 taken along line b-b (the Y axis) of FIG. 18A, and FIG. 18C is a cross-sectional view of the semiconductor device 200 taken along line c-c (the Y axis) of FIG. 18A. In some embodiments, the contact plugs 280-1, 282-1, 280-2, and 282-2 are formed to extend through an IMD or ILD layer 284 (shown in FIGS. 18B and 18C) disposed above the IMD or ILD layer 256. More specifically, as better seen in the cross-sectional views of FIGS. 18B and 18C, the contact plug 280-1 extends through the IMD or ILD layer 284 to contact the gate electrode 262-1; the contact plugs 282-1 each extends through the IMD or ILD layer 284 to contact the respective source/drain features 250; the contact plug 280-2 extends through the IMD or ILD layer 284 to contact the gate electrode 262-2; and the contact plugs 282-2 each extends through the IMD or ILD layer 284 to contact the respective source/drain features 252.

In some embodiments, the contact plugs 280-1, 282-1, 280-2, and 282-2 may each include a metal material such as, for example, Al, Cu, W, Ti, Ta, TiN, TiAl, TiAlN, TaN, NiSi, CoSi, or combinations thereof. The contact plugs 280-1, 282-1, 280-2, and 282-2 may be each formed by performing at least some of the following processes: forming a patternable layer (e.g., a hardmask layer, a photoresist layer, etc.) over the IMD or ILD layer 284, wherein the patternable layer has openings aligned with respective areas where the contact plugs are to be formed; using the patternable layer as a mask to perform at least one dry/wet etching process to etch through the IMD or ILD layer 284 so as to expose respective conductive features (e.g., the gate electrode 262-1, the source/drain features 250, the gate electrode 262-2, the source/drain features 252); using a suitable process such as ALD, CVD, PVD, plating, or combination thereof to refill the etched portions of the IMD or ILD layer 284 with the above-mentioned metal material (e.g., W).

In some embodiments, after the formation of the contact plugs 280-1, 282-1, 280-2, and 282-2, the at least two FinFETs, as mentioned above, may be respectively formed in the logic and RF regions. Specifically, the left upper fin 218-1, the oxide layer 222, the source/drain features 250, the first spacer 236, the gate stack 260-1, and the contact plugs 280-1 and 282-1 form a FinFET in the logic region (hereinafter "logic FinFET"), wherein the left upper fin 218-1 serves as the conduction channel, and the contact plugs 208-1 and 282-1 respectively serve as gate and source/drain contacts. And the right upper fin 218-2, the oxide layer 222, the source/drain features 252, the second spacer 246, the gate stack 260-2, and the contact plugs 280-2 and 282-2 form another FinFET in the RF region (hereinafter "RF FinFET"), wherein the right upper fin 218-2 serves as the conduction channel, and the contact plugs 208-2 and 282-2 respectively serve as gate and source/drain contacts.

As described with respect to FIGS. 13B and 13C, the lateral distance 248-1, in the logic region, by which the first spacer 236 extends from the sidewall 235b is substantially shorter than the lateral distance 248-2, in the RF region, by which the second spacer 246 extends from the sidewall 237b. Referring again to FIGS. 18B and 18C, accordingly, the source/drain features 252 and the gate feature 260-2 of the RF FinFET can be laterally separated, by the second spacer 246, with a longer distance 248-2 when compared to the separation distance 248-1 between the source/drain features 250 and the gate feature 260-1 of the logic FinFET.

As such, the above-mentioned issues (e.g., the high parasitic capacitance induced between the gate and source/drain features) observed in conventional FinFETs can be avoided. For example, the second spacer 246 of the RF FinFET includes multiple dielectric layers, at least one of which is kept in its original thickness (e.g., the layers of 246a), such that a parasitic capacitance between the respective gate and source/drain features can be advantageously suppressed. Moreover, by using the disclosed method 100 to make a semiconductor device (e.g., the semiconductor device 200), two FinFET's, which have respective different spacer thicknesses, can be concurrently formed. For example, the logic FinFET, which is typically less sensitive to the parasitic capacitance, and the RF FinFET, which is typically more sensitive to the parasitic capacitance, can be concurrently formed to have respective suitable spacer thicknesses.

Figure 19A:
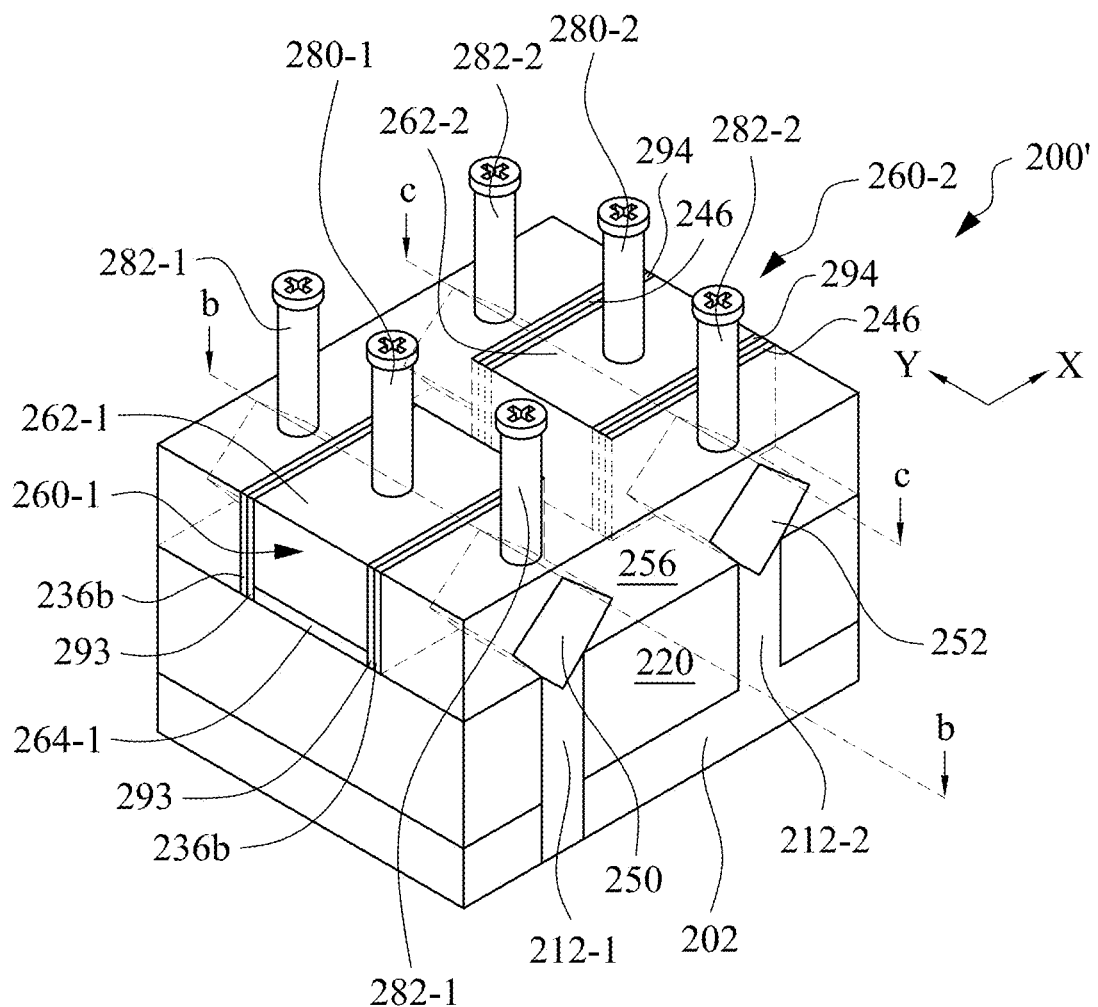
FIG. 19A illustrates a perspective view of an exemplary semiconductor device, in accordance with some embodiments.
Figure 19B:
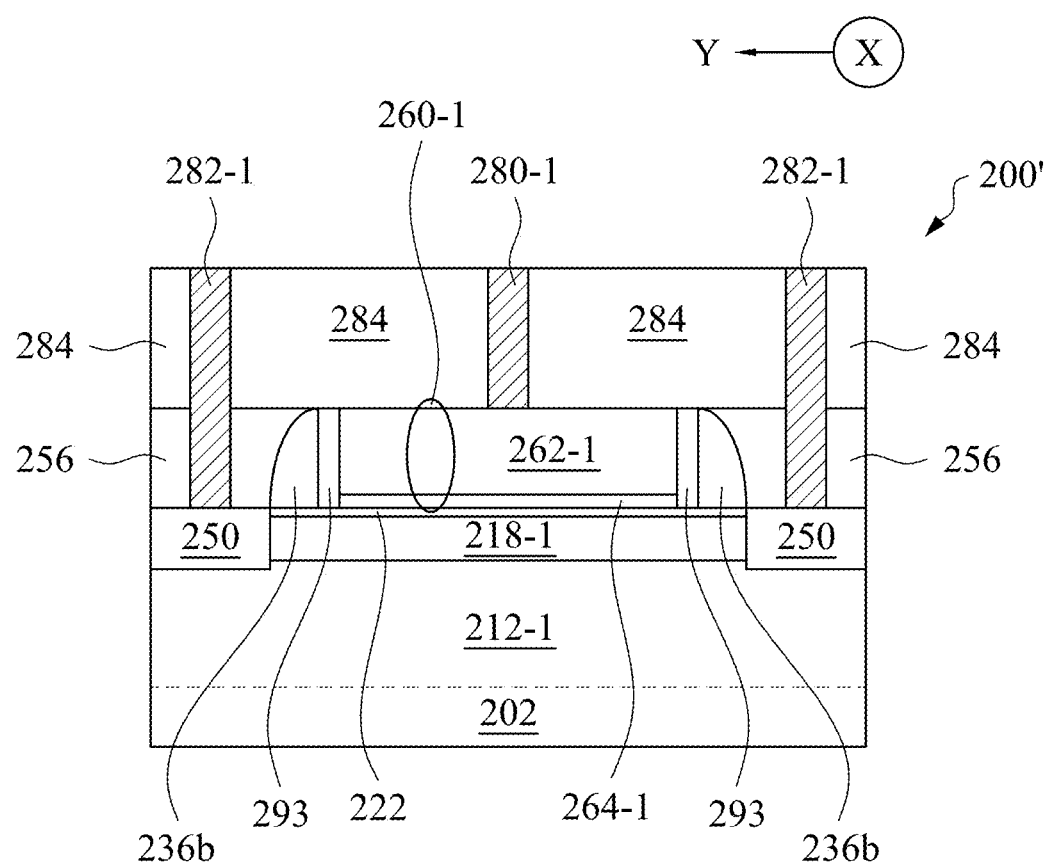
FIG. 19B/19C illustrate corresponding cross-sectional views of FIG. 18A, in accordance with some embodiments.
Figure 19C:
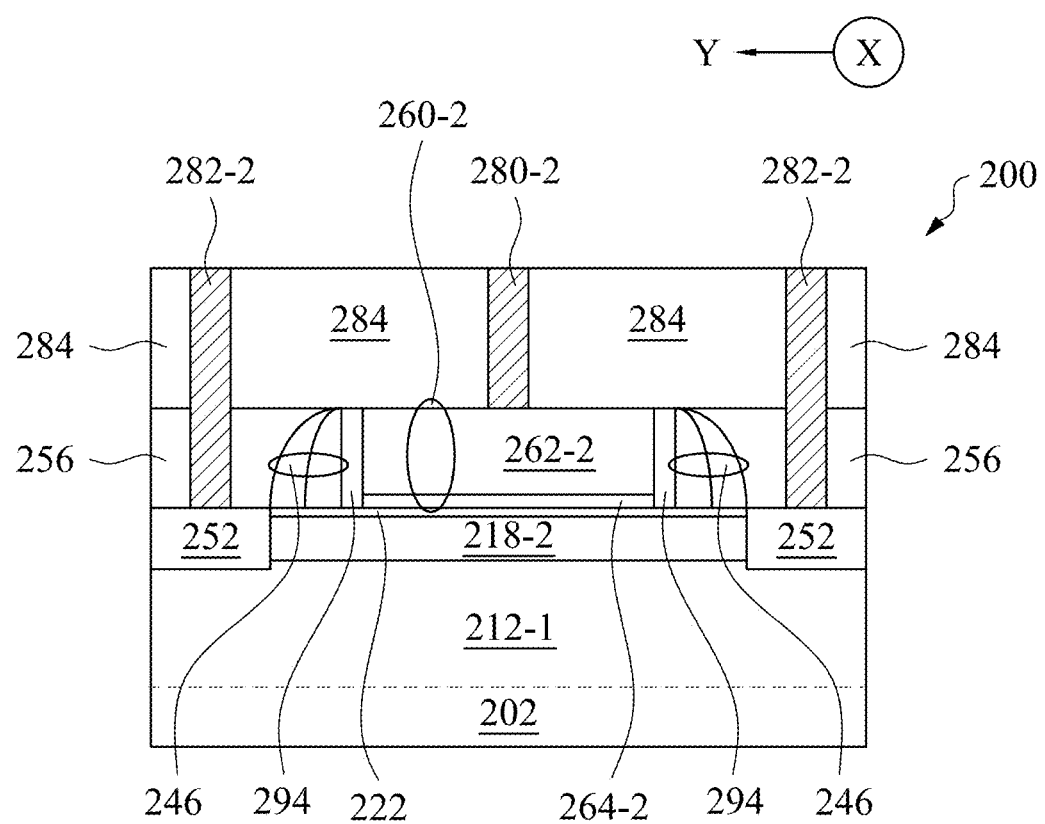

FIG. 19A is a perspective view of the semiconductor device 200' including contact plugs 280-1, 282-1, 280-2, and 282-2, which are formed at one of the various stages of fabrication, according to some embodiments. FIG. 19B is a cross-sectional view of the semiconductor device 200' taken along line b-b (the Y axis) of FIG. 19A, and FIG. 18C is a cross-sectional view of the semiconductor device 200' taken along line c-c (the Y axis) of FIG. 19A. As discussed before, the first portion 236a of the first spacer 236 may have a thickness substantially close to zero (i.e., no presence of such a first portion 236a of the first spacer 236). As shown in FIG. 19B, the first spacer 236 of the semiconductor device 200' merely includes the portion 236b and does not have the portion 236a. In contrast, as shown in FIG. 19C, the second spacer 246 of the semiconductor device 200' still has two portions (246a, 246b). As discussed before, each of the portions 236b, 246a, 246b may include one or more of: silicon oxide (SiO), silicon nitride (SiN), silicon oxynitride (SiON), silicon carbonitride (SiCN), silicon oxycarbonitride (SiOCN), or other suitable material.

In this case, the width of the first spacer 236 (i.e. 236b in this embodiment) extending along the Y axis in the logic region as shown in FIG. 19B, is substantially shorter than the width of the second spacer 246 extending along the Y axis in the RF region as shown in FIG. 19C. Accordingly, the source/drain features 252 and the gate feature 260-2 of the RF FinFET can be laterally separated, by the second spacer 246, with a longer distance when compared to the separation distance between the source/drain features 250 and the gate feature 260-1 of the logic FinFET. As such, the above-mentioned issues (e.g., the high parasitic capacitance induced between the gate and source/drain features) observed in conventional FinFETs can be avoided.

In one embodiment, as shown in FIGS. 19B and 19C, there is a protection layer 293 formed outside the gate electrode 262-1 in the logic region, and there is a protection layer 294 formed outside the gate electrode 262-2 in the RF region. The protection layer 293 and the protection layer 294 may include silicon oxide (SiO$_x$) for recovering damage from poly etching. In one example, the protection layer 293 and the protection layer 294 are formed after the operation 130 in which the plurality of dummy stacks are removed to respectively form a plurality of voids, and before the operation 132 in which each of the plurality of voids is filled with a respective gate feature. In another example, the protection layer 293 and the protection layer 294 are part of the gate feature 260-1 and gate feature 260-2, respectively. That is, the protection layer 293 and the protection layer 294 may be formed with the gate feature 260-1 and gate feature 260-2, respectively. In one embodiment, while the width of the protection layer 293 extending along the Y axis in the logic region is the same as or similar to the width of the protection layer 294 extending along the Y axis in the RF region, the source/drain features 252 and the gate feature 260-2 of the RF FinFET is again laterally separated with a longer distance when compared to the separation distance between the source/drain features 250 and the gate feature 260-1 of the logic FinFET.

Although the above-described method 100 is directed to making a semiconductor device including at least one logic FinFET and one RF FinFET, it is noted that the method 100 can be also used to make either one of logic and RF FinFETs while remaining within the scope of the present disclosure. For example, to form an RF FinFET, the operations 118 and 120 of the method 100 may be skipped; to form a logic FinFET (with only one portion of the spacer), the operations 118, 122, and 124 of the method 100 may be skipped.

In an embodiment, a semiconductor device includes: first and second fin structures, disposed on a substrate, that respectively extend in parallel to an axis; a first gate feature that traverses the first fin structure to overlay a central portion of the first fin structure; a second gate feature that traverses the second fin structure to overlay a central portion of the second fin structure; a first spacer comprising: a first portion comprising two layers that respectively extend from sidewalls of the first gate feature toward opposite directions of the axis; and a second portion comprising two layers that respectively extend from sidewalls of the first portion of the first spacer toward the opposite directions of the axis; and a second spacer comprising two layers that respectively extend from sidewalls of the second gate feature toward the opposite directions of the axis.

In another embodiment, a semiconductor device includes: first and second fin structures, disposed on a substrate, that respectively extend in parallel to an axis; a first gate feature that traverses the first fin structure to overlay a central portion of the first fin structure; a second gate feature that traverses the second fin structure to overlay a central portion of the second fin structure; a first spacer comprising: a first portion comprising two layers that respectively extend from sidewalls of the first gate feature toward opposite directions of the axis; and a second portion comprising two layers that respectively extend from sidewalls of the first portion of the first spacer toward the opposite directions of the axis; and a second spacer comprising: a first portion comprising two layers that respectively extend from sidewalls of the second gate feature toward the opposite directions of the axis; and a second portion comprising two layers that respectively extend from sidewalls of the first portion of the second spacer toward the opposite directions of the axis, wherein a thickness of the first portion of the second spacer is substantially thinner than a thickness of the first portion of the first spacer.

In yet another embodiment, a method for forming a fin field-effect transistor (FinFET) includes: forming first and second fin structures each protruding from an upper boundary surface of an isolation feature; forming a first dummy stack traversing a central portion of the first fin structure, and a second dummy stack traversing a central portion of the second fin structure; forming a first dielectric layer overlaying the first and second dummy stacks; etching a portion of the first dielectric layer that overlays the first dummy stack; forming a second dielectric layer overlaying the first and second dummy stacks; and etching the second dielectric layer to form a first spacer extending along a sidewall of the first dummy stack and a second spacer extending along a sidewall of the second dummy stack, wherein the first and second spacers each comprises both the first and second dielectric layers, wherein the first dielectric layer of the first spacer is substantially thinner than the first dielectric layer of the second spacer.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin field-effect transistor (FinFET) comprising:
   a substrate;
   an isolation feature formed on the substrate;
   first and second fin structures each protruding from an upper boundary surface of the isolation feature;
   a first gate feature traversing a central portion of the first fin structure;
   a second gate feature traversing a central portion of the second fin structure;
   a first spacer extending along a sidewall of the first gate feature; and
   a second spacer extending along a sidewall of the second gate feature, wherein the first and second spacers each comprises first and second dielectric layers, wherein the first dielectric layer of the first spacer is substantially thinner than the first dielectric layer of the second spacer, wherein:
     the first fin structure, the first gate feature and the first spacer are within a logic region configured to perform logic functions, and
     the second fin structure, the second gate feature and the second spacer are within a radio frequency (RF) region configured to perform RF functions.

2. The FinFET of claim 1, wherein the first spacer surrounds a side portion of the first fin structure, the side portion being immediately adjacent to the central portion of the first fin structure, and the second spacer surrounds a side portion of the second fin structure, the side portion being immediately adjacent to the central portion of the second fin structure.

3. The FinFET of claim 1, further comprising a first source/drain feature along the first fin structure and laterally adjacent an outer sidewall of the first spacer, and a second source/drain feature along the second fin structure and laterally adjacent an outer sidewall of the second spacer.

4. The FinFET of claim 3, wherein the first source/drain feature is electromagnetically isolated from the first gate feature by at least the first spacer, and the second source/drain feature is electromagnetically isolated from the second gate feature by at least the second spacer.

5. The FinFET of claim 3, further comprising:
   a first contact structure coupled to the first source/drain feature and the first gate feature; and
   a second contact structure coupled to the second source/drain feature and the second gate feature.

6. The FinFET of claim 3, wherein the first and second gate features each comprises a gate dielectric layer and at least a gate conductive layer disposed above the gate dielectric layer.

7. The FinFET of claim 6, wherein the gate dielectric layer comprises a high-k dielectric layer, and the gate conductive layer comprises at least a metal layer or a polysilicon layer.

8. A fin field-effect transistor (FinFET) comprising:
   a substrate;
   an isolation feature formed on the substrate;
   first and second fin structures each protruding from an upper boundary surface of the isolation feature and extending in parallel to an axis;
   a first gate feature traversing a central portion of the first fin structure;
   a second gate feature traversing a central portion of the second fin structure, wherein the central portion of the first fin structure and the central portion of the second fin structure are aligned to each other along a same line that is perpendicular to the axis;
   a first spacer extending along a sidewall of the first gate feature; and
   a second spacer extending along a sidewall of the second gate feature, wherein the first and second spacers each comprises first and second dielectric layers, wherein the first dielectric layer of the first spacer is substantially thinner than the first dielectric layer of the second spacer, wherein:
     the first fin structure, the first gate feature and the first spacer are within a logic region configured to perform logic functions, and
     the second fin structure, the second gate feature and the second spacer are within a radio frequency (RF) region configured to perform RF functions.

9. The FinFET of claim 8, wherein the first spacer surrounds a side portion of the first fin structure, the side portion being immediately adjacent to the central portion of the first fin structure, and the second spacer surrounds a side portion of the second fin structure, the side portion being immediately adjacent to the central portion of the second fin structure.

10. The FinFET of claim 8, further comprising:
    a first source/drain feature along the first fin structure and laterally adjacent an outer sidewall of the first spacer, and
    a second source/drain feature along the second fin structure and laterally adjacent an outer sidewall of the second spacer.

11. The FinFET of claim 10, wherein the first source/drain feature is electromagnetically isolated from the first gate feature by at least the first spacer, and the second source/drain feature is electromagnetically isolated from the second gate feature by at least the second spacer.

12. The FinFET of claim 10, further comprising:
    a first contact structure coupled to the first source/drain feature and the first gate feature; and
    a second contact structure coupled to the second source/drain feature and the second gate feature.

13. The FinFET of claim 10, wherein the first and second gate features each comprises a gate dielectric layer and at least a gate conductive layer disposed above the gate dielectric layer.

14. The FinFET of claim 13, wherein the gate dielectric layer comprises a high-k dielectric layer, and the gate conductive layer comprises at least a metal layer or a polysilicon layer.

15. A fin field-effect transistor (FinFET) comprising:
    a substrate;
    an isolation feature formed on the substrate;

a plurality of fin structures, including first and second fin structures, each protruding from an upper boundary surface of the isolation feature;

a first gate feature traversing a central portion of the first fin structure;

a second gate feature traversing a central portion of the second fin structure;

a first protection layer extending along a sidewall of the first gate feature;

a second protection layer extending along a sidewall of the second gate feature;

a first spacer extending along a sidewall of the first protection layer such that the first protection layer is disposed between the first spacer and the first gate feature; and a second spacer extending along a sidewall of the second protection layer such that the second protection layer is disposed between the second spacer and the second gate feature, wherein the first and second spacers each comprises both first and second dielectric layers, wherein the first dielectric layer of the first spacer is substantially thinner than the first dielectric layer of the second spacer, wherein:

the first fin structure, the first gate feature, the first protection layer and the first spacer are within a logic region configured to perform logic functions, and the second fin structure, the second gate feature, the second protection layer and the second spacer are within a radio frequency (RF) region configured to perform RF functions.

16. The FinFET of claim 15, wherein the first spacer surrounds a side portion of the first fin structure, the side portion being immediately adjacent to the central portion of the first fin structure, and the second spacer surrounds a side portion of the second fin structure, the side portion being immediately adjacent to the central portion of the second fin structure.

17. The FinFET of claim 15, further comprising:
a first source/drain feature along the first fin structure and laterally adjacent an outer sidewall of the first spacer; and
a second source/drain feature along the second fin structure and laterally adjacent an outer sidewall of the second spacer.

18. The FinFET of claim 17, further comprising:
a first contact structure coupled to the first source/drain feature and the first gate feature; and
a second contact structure coupled to the second source/drain feature and the second gate feature.

19. The FinFET of claim 17, wherein the first and second gate features each comprises a gate dielectric layer and at least a gate conductive layer disposed above the gate dielectric layer.

20. The FinFET of claim 19, wherein the gate dielectric layer comprises a high-k dielectric layer, and the gate conductive layer comprises at least a metal layer or a polysilicon layer.

* * * * *